United States Patent
Dong et al.

(10) Patent No.: US 12,488,988 B2
(45) Date of Patent: Dec. 2, 2025

(54) SEMICONDUCTOR DEVICE AND METHOD FOR MANUFACTURING SEMICONDUCTOR DEVICE

(71) Applicant: HAMAMATSU PHOTONICS K.K., Hamamatsu (JP)

(72) Inventors: Wei Dong, Hamamatsu (JP); Kazuyoshi Hirose, Hamamatsu (JP)

(73) Assignee: HAMAMATSU PHOTONICS K.K., Shizuoka (JP)

( * ) Notice: Subject to any disclaimer, the term of this patent is extended or adjusted under 35 U.S.C. 154(b) by 426 days.

(21) Appl. No.: 18/095,620

(22) Filed: Jan. 11, 2023

(65) Prior Publication Data

US 2023/0298897 A1 Sep. 21, 2023

(30) Foreign Application Priority Data

Mar. 16, 2022 (JP) ................. 2022-041487

(51) Int. Cl.
*H01L 21/30* (2006.01)
*H01L 21/3065* (2006.01)
*H01L 21/3205* (2006.01)
*H10H 20/819* (2025.01)
*H10F 30/227* (2025.01)
*H10H 20/01* (2025.01)

(52) U.S. Cl.
CPC .. *H01L 21/30655* (2013.01); *H01L 21/32053* (2013.01); *H10H 20/819* (2025.01); *H10F 30/227* (2025.01); *H10H 20/034* (2025.01)

(58) Field of Classification Search
CPC ........ H01L 21/30655; H01L 21/32053; H10H 20/819; H10H 20/034; H10F 30/227; H10F 30/2275; H10F 77/206; H10F 30/22; H10F 71/00; H10F 77/306; H10F 77/14
See application file for complete search history.

(56) References Cited

U.S. PATENT DOCUMENTS

| | | | | |
|---|---|---|---|---|
| 2007/0217473 A1* | 9/2007 | Abe | .................... | H01S 3/09415 372/50.23 |
| 2013/0164935 A1* | 6/2013 | Nilsson | ................. | H01L 23/481 438/667 |
| 2013/0328195 A1* | 12/2013 | Engelhardt | ......... | H01L 21/3085 438/597 |
| 2015/0295034 A1* | 10/2015 | Laven | .................. | H10D 64/513 257/139 |

(Continued)

FOREIGN PATENT DOCUMENTS

| JP | S62-055990 A | 3/1987 |
|---|---|---|
| JP | S6255990 A * | 3/1987 |

(Continued)

*Primary Examiner* — S M Sohel Imtiaz
(74) *Attorney, Agent, or Firm* — Faegre Drinker Biddle & Reath LLP

(57) ABSTRACT

Provided is a semiconductor device including: a semiconductor layer having an uneven structure configured to include a recessed portion on one surface side thereof; a first electrode film (first deposited film) provided on the one surface of the semiconductor layer; and a second electrode film (second deposited film) provided on a bottom surface of the recessed portion, wherein an enlarged portion having a cross-sectional area enlarged with respect to a portion on an opening portion side of the recessed portion is provided.

10 Claims, 14 Drawing Sheets

(56) References Cited

U.S. PATENT DOCUMENTS

2017/0330930 A1* 11/2017 Cook ................ H01L 23/49541

FOREIGN PATENT DOCUMENTS

| JP | H03-016288 A | 1/1991 |
| --- | --- | --- |
| JP | H11-307242 A | 11/1999 |
| JP | 2006-108328 A | 4/2006 |
| JP | 2007-173393 A | 7/2007 |
| JP | 2007-273832 A | 10/2007 |
| JP | 2013-168611 A | 8/2013 |

* cited by examiner

SEMICONDUCTOR DEVICE AND METHOD FOR MANUFACTURING SEMICONDUCTOR DEVICE

TECHNICAL FIELD

The present disclosure relates to a semiconductor device and a method for manufacturing a semiconductor device.

BACKGROUND

As a conventional semiconductor device, for example, there is a photodiode described in Japanese Unexamined Patent Publication No. 2007-273832. In this conventional photodiode, a comb-shaped periodic uneven structure is provided on a surface of a semiconductor layer. In the periodic uneven structure, a first electrode is disposed on a top surface of a protruding portion, and a second electrode is disposed on a bottom surface of a recessed portion. In this photodiode, surface plasmon resonance based on incident light is excited by the first electrode and the second electrode. The excited surface plasmons excite photons containing near-field light at an interface of at least one of the first electrode and the second electrode with the semiconductor. Electron-hole pairs are generated in a depletion layer in the semiconductor layer near the first electrode and near the second electrode by the near-field light, and a photocurrent is obtained.

SUMMARY

In manufacturing the semiconductor device as described above, a method for forming a deposited film of a metal or the like on the semiconductor layer provided with the uneven structure may be adopted. In this case, for the purpose of forming a pair of electrodes or the like, it is important to electrically separate the deposited film on one surface of the semiconductor layer from the deposited film on the bottom portion of the recessed portion. However, in the actual deposition field, it is conceivable that deposited films adhere not only to one surface of a semiconductor layer and a bottom surface of a recessed portion, which are target positions, but also to an inner wall surface of the recessed portion, and as a result, the deposited films are electrically connected to each other.

The present disclosure has been made to solve the above problems, and an object thereof is to provide a semiconductor device and a method for manufacturing a semiconductor device in which deposited films can be suitably separated in an uneven structure.

A semiconductor device according to one aspect of the present disclosure includes: a semiconductor layer having an uneven structure configured to include a recessed portion on one surface side thereof; a first deposited film provided on the one surface of the semiconductor layer; and a second deposited film provided on a bottom surface of the recessed portion, wherein the recessed portion is provided with an enlarged portion having a cross-sectional area enlarged with respect to a portion on an opening portion side of the recessed portion.

In this semiconductor device, the recessed portion is provided with the enlarged portion having a cross-sectional area enlarged with respect to the portion on the opening portion side of the recessed portion. In the recessed portion having such an enlarged portion, it is possible to form a portion that is not hit by atoms entering the recessed portion through the opening portion on an inner wall surface of the recessed portion when the deposited films are formed. Accordingly, the first deposited film provided on the one surface of the semiconductor layer and the second deposited film provided on the bottom surface of the recessed portion can be appropriately separated.

The inner wall surface of the recessed portion may be provided with a narrowed portion formed by narrowing an intermediate portion with respect to the opening portion of the recessed portion. In the narrowed portion, a cross-sectional area of the recessed portion decreases once and then increases. Accordingly, when the deposited films are formed, the portion that is not hit by the atoms entering the recessed portion through the opening portion can be reliably formed by the inner wall surface of the recessed portion.

The narrowed portion may be configured of a first inclined surface that gradually decreases the cross-sectional area of the recessed portion toward the bottom surface of the recessed portion, and a second inclined surface that is continuous with the first inclined surface and gradually increases the cross-sectional area of the recessed portion toward the bottom surface of the recessed portion. In this case, the second inclined surface can be caused to function as a surface that is not hit by the atoms entering the recessed portion through the opening portion. Accordingly, the first deposited film provided on a top surface of a protruding portion and the second deposited film provided on the bottom surface of the recessed portion can be separated more reliably.

The first inclined surface may be continuous with the opening portion of the recessed portion. In this case, since the narrowed portion is continuous with the opening portion of the recessed portion, a separation position between the first deposited film and the second deposited film can be brought closer to the opening portion of the recessed portion. Thus, a distance between the first deposited film and the second deposited film is sufficiently secured, and the two can be separated more reliably. In particular, in a case in which the semiconductor device is formed in a surface incidence type (a type of light incidence from one surface side of a semiconductor layer), reflection loss can be inhibited by continuously changing a refractive index at the opening portion.

The first inclined surface may be separated from the opening portion of the recessed portion. In this case, since the narrowed portion is separated from the opening portion of the recessed portion, the separation position between the first deposited film and the second deposited film can be kept away from the opening portion of the recessed portion. Thus, especially in a case in which the semiconductor device is a back-illuminated type (a type of light incidence from the other surface side of the semiconductor layer), light leakage through the opening portion is inhibited, and improvement of light absorption efficiency is achieved.

The first deposited film and the second deposited film may be metal films. In this case, by using the first deposited film and the second deposited film as various functional films such as electrodes, scatterers, reflective films, or near-field excitation sources, an MSM photodetector or a photodetector utilizing a near-field excitation effect can be formed.

On the one surface side of the semiconductor layer, an insulating film or dielectric film may be provided between the metal film and the semiconductor layer. According to such a configuration, for example, a dark current can be inhibited when the metal film is used as an electrode.

The semiconductor layer may include a first conductivity type semiconductor layer and a second conductivity type semiconductor layer, the recessed portion may extend through the second conductivity type semiconductor layer into the first conductivity type semiconductor layer, and the narrowed portion may be located in the second conductivity type semiconductor layer. In this case, by using the second deposited film as a near-field excitation source, a photodetector utilizing the near-field excitation effect can be formed.

A method for manufacturing a semiconductor device according to one aspect of the present disclosure includes: a processing step of forming an uneven structure including a recessed portion on one surface side of a semiconductor layer; and a deposition step of performing film formation through deposition on the one surface side of the semiconductor layer to form a first deposited film on one surface of the semiconductor layer and to form a second deposited film on a bottom surface of the recessed portion, wherein the processing step includes a first step performed by anisotropic etching and a second step including isotropic etching subsequent to the first step.

In this method for manufacturing a semiconductor device, by combining the first step performed by anisotropic etching and the second step including the isotropic etching subsequent thereto, the processing step of forming the uneven structure on the one surface side of the semiconductor layer is performed. In the anisotropic etching, a width of the formed recessed portion is constant or gradually narrows as the process progresses. On the other hand, in the isotropic etching, the width of the recessed portion gradually widens at the beginning of the process, and the enlarged portion having a cross-sectional area enlarged with respect to the portion on the opening portion side of the recessed portion is formed in the recessed portion. Also, after the enlarged portion is formed, etching may be continued vertically so that the width of the recessed portion is within a certain range.

In the first step, reactive ion etching may be used as the anisotropic etching, and in the second step including the isotropic etching, a Bosch process may be used. By combining the reactive ion etching and the Bosch process, the enlarged portion can be formed easily and accurately.

DETAILED DESCRIPTION

Preferred embodiments of a semiconductor device and a method for manufacturing a semiconductor device according to one aspect of the present disclosure will be described in detail below with reference to the drawings. In each of the embodiments and drawings of the semiconductor device shown below, structural units of one main portion are shown, but in an actual semiconductor device, these structural units may be arrayed at a predetermined pitch.

First Embodiment

Figure 1A:
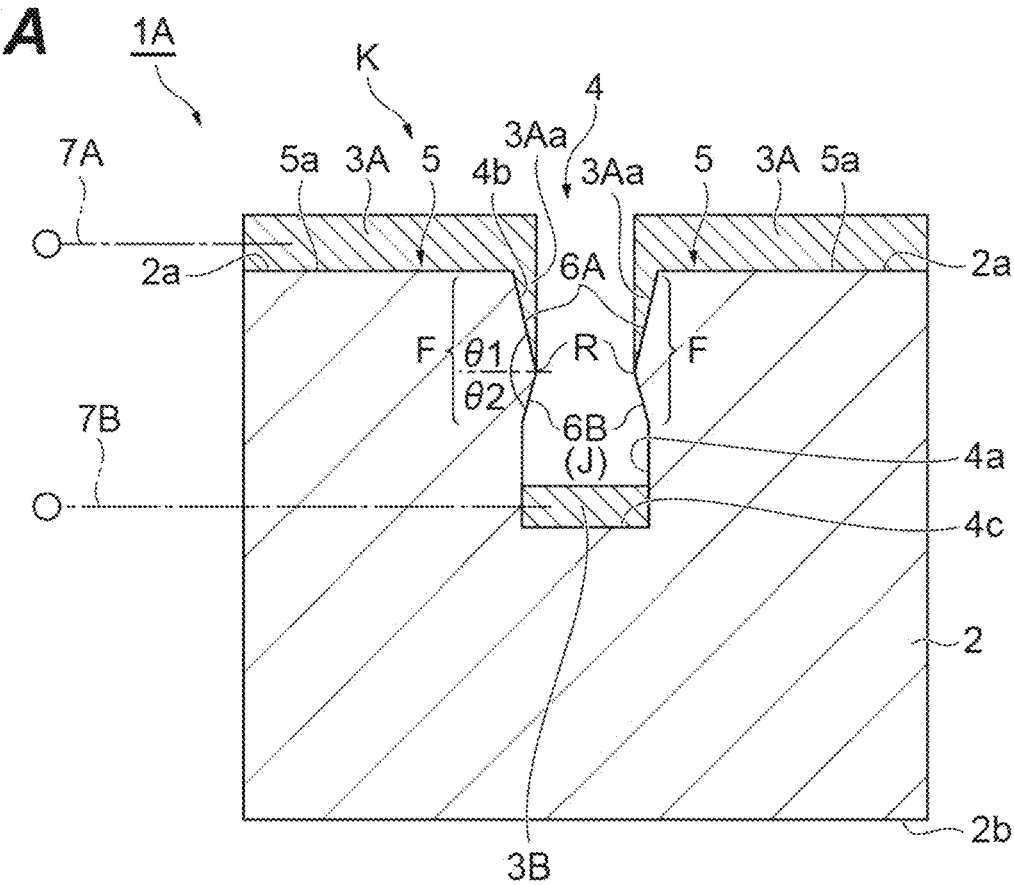
FIG. 1A is a schematic cross-sectional view showing a configuration of a semiconductor device according to a first embodiment of the present disclosure.
Figure 1B:
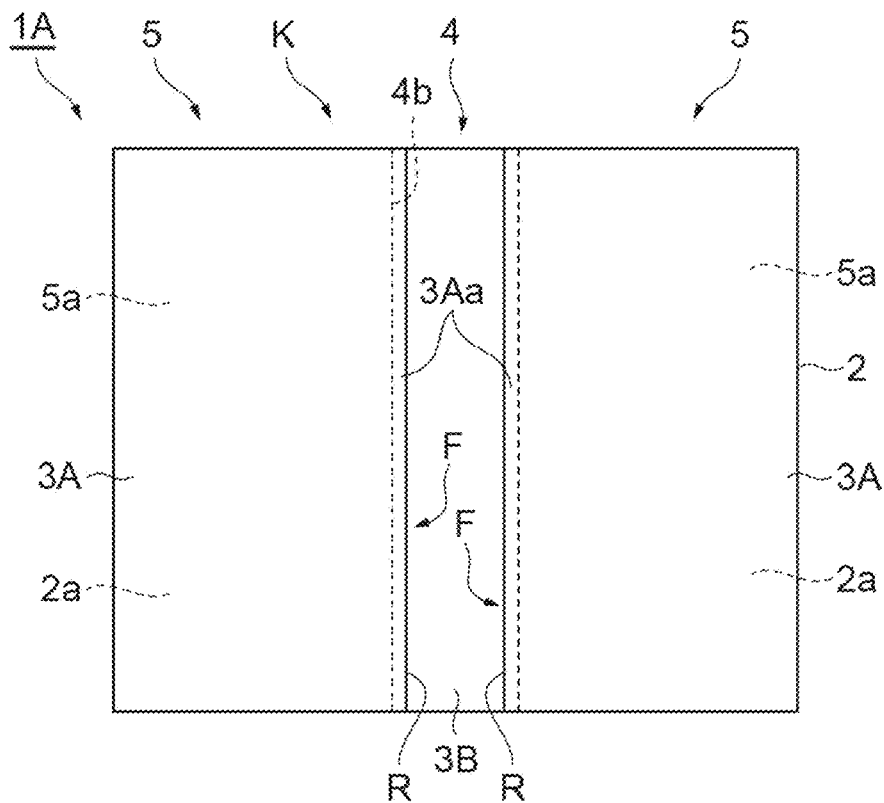
FIG. 1B is a plan view of FIG. 1A.

FIG. 1A is a schematic cross-sectional view showing a configuration of a semiconductor device according to a first embodiment of the present disclosure. FIG. 1B is a plan view thereof. A semiconductor device 1A according to the first embodiment is formed as a vertical metal-semiconductor-metal (MSM) photodetector having comb-shaped electrode pairs. As shown in the figures, the semiconductor device 1A is configured to include a semiconductor layer 2, a first electrode film (a first deposited film) 3A, and a second electrode film (a second deposited film) 3B.

In the present embodiment, for convenience, one surface 2a side of the semiconductor layer 2 is defined as a front surface, and the other surface 2b side of the semiconductor layer 2 is defined as a back surface. The semiconductor device 1A may be a front-illuminated photodetector on which incident light is incident from the front surface side, or may be a back-illuminated type photodetector on which incident light is incident from the back surface side.

The semiconductor layer 2 is made of Si, for example. The semiconductor layer 2 has, for example, a rectangular shape in a plan view. The semiconductor layer 2 has the one surface 2a and the other surface 2b opposite to the one surface 2a. An uneven structure K including a recessed portion 4 is provided on the one surface 2a side of the semiconductor layer 2. The uneven structure K is formed, for example, by processing the one surface 2a side of the semiconductor layer 2 by etching or the like. A portion processed by etching or the like constitutes the recessed portion 4 in the uneven structure K, and a portion (the one surface 2a of the semiconductor layer 2) that is not processed by etching or the like constitutes a protruding portion 5 in the uneven structure K. The protruding portion 5 may also include a structure in which the recessed portion 4 is formed on a flat surface.

In a plan view of the semiconductor layer 2, the recessed portion 4 linearly extends in one direction of an in-plane direction of the one surface 2a to extend from one side to the other side on the one surface 2a side of the semiconductor layer 2 (see FIG. 1B). The recessed portion 4 is provided with an enlarged portion J having a cross-sectional area enlarged with respect to a portion of the recessed portion 4 on an opening portion 4b side thereof. The cross-sectional area here is a cross-sectional area on a plane perpendicular to a depth direction of the recessed portion 4 (a plane extending in a width direction of the recessed portion 4 in FIG. 1A). In the present embodiment, in forming the enlarged portion J, an inner wall surface 4a of the recessed portion 4 is provided with a narrowed portion F that narrows an intermediate portion with respect to the opening portion 4b of the recessed portion 4. The intermediate portion is a portion located between the opening portion 4b and a bottom surface 4c of the recessed portion 4 in the depth direction. The narrowed portion F is provided on the inner wall surface 4a of the recessed portion 4 at a portion between the opening portion 4b and the bottom surface 4c.

The narrowed portion F is configured of a first inclined surface 6A that gradually decreases a cross-sectional area of the recessed portion 4 toward the bottom surface 4c of the recessed portion 4, and a second inclined surface 6B that is continuous with the first inclined surface 6A and gradually increases the cross-sectional area of the recessed portion 4 toward the bottom surface 4c of the recessed portion 4. The recessed portion 4 having the narrowed portion F can be formed, for example, by two-step dry etching. A portion from the opening portion 4b to the first inclined surface 6A can be formed by, for example, anisotropic etching such as reactive ion etching. A portion from the second inclined surface 6B to the bottom surface 4c can be formed by etching including isotropic etching such as a Bosch process.

An inclination angle θ1 of the first inclined surface 6A with respect to the bottom surface 4c of the recessed portion 4 and an inclination angle θ2 of the second inclined surface 6B with respect to the bottom surface 4c of the recessed portion 4 are not particularly limited. The inclination angle θ1 of the first inclined surface 6A and the inclination angle θ2 of the second inclined surface 6B may be equal to or different from each other. The inclination angle θ1 of the first inclined surface 6A may be larger than the inclination angle θ2 of the second inclined surface 6B, or may be smaller than the inclination angle θ2 of the second inclined surface 6B.

In the present embodiment, the first inclined surface 6A is continuous with the opening portion 4b of the recessed portion 4. The cross-sectional area of the recessed portion 4 gradually decreases from a position of the opening portion 4b due to the first inclined surface 6A and is the smallest at a boundary portion R between the first inclined surface 6A and the second inclined surface 6B. In the present embodiment, the enlarged portion J is configured by the second inclined surface 6B. The cross-sectional area of the recessed portion 4 gradually increases from the boundary portion R to the second inclined surface 6B and is constant between the second inclined surface 6B and the bottom surface 4c. Due to such a configuration of the recessed portion 4, the second inclined surface 6B cannot be seen from the one surface 2a side of the semiconductor layer 2 in a plan view of the semiconductor layer 2.

The Bosch process described above is a type of dry etching technique in which formation of a recessed portion is performed while steps of isotropic etching, protective film formation, and anisotropic etching (protective film removal) are repeated. $SF_6$ can be used for an etching gas for processing Si, which is the semiconductor layer 2. For example, $C_4F_8$ can be used for a protective film.

In a case in which the Bosch process is used, the inner wall surface 4a of the recessed portion 4 may be formed corrugated in accordance with repetition of the above steps. However, the unevenness due to the corrugation of the inner wall surface 4a by the Bosch process is sufficiently smaller than an amount of narrowing of the cross-sectional area of the recessed portion 4 due to the narrowed portion F (that is, an amount of protrusion toward a central axis of the recessed portion 4 due to the first inclined surface 6A and the second inclined surface 6B). For this reason, the inner wall surface 4a between the second inclined surface 6B and the bottom surface 4c can be regarded as a flat surface, and its influence on the formation of the narrowed portion F can be ignored.

Both the first electrode film 3A and the second electrode film 3B are metal films formed by deposition of metal materials such as gold (Au), silver (Ag), copper (Cu), aluminum (Al), and the like. The first electrode film 3A and the second electrode film 3B may be formed by deposition of a compound material containing these metals. Both the first electrode film 3A and the second electrode film 3B are in Schottky junction with the semiconductor layer 2 and are electrically connected to an external circuit (not shown) by mutually independent wirings 7A and 7B.

In the uneven structure K, the first electrode film 3A is located on a top surface 5a of the protruding portion 5, and the second electrode film 3B is located on the bottom surface 4c of the recessed portion 4. Here, the first electrode film 3A is formed over the entire top surface 5a of the protruding portion 5, and the second electrode film 3B is formed over the entire bottom surface 4c of the recessed portion 4 (see FIG. 1B).

The first electrode film 3A and the second electrode film 3B are separated from each other at least at the narrowed portion F of the recessed portion 4. In the example of FIG. 1A, on the inner wall surface 4a of the recessed portion 4, the first electrode film 3A located on the top surface 5a of the protruding portion 5 also extends to the first inclined surface 6A, but a tip of the extended portion 3Aa stops at the boundary portion R between the first inclined surface 6A and the second inclined surface 6B. The second electrode film 3B is located below a lower end of the second inclined surface 6B. As a result of the formation of the narrowed portion F on the inner wall surface 4a of the recessed portion 4, the second electrode film 3B has a trapezoidal cross-section that widens toward the bottom surface 4c when viewed in an extending direction of the recessed portion 4.

Next, a method for manufacturing a semiconductor device will be described. Here, a manufacturing process of the semiconductor device 1A described above will be shown, but the manufacturing process can be applied mutatis mutandis to semiconductor devices 1B to 1F according to second to sixth embodiments and modified examples, which will be described later.

Figure 2A:
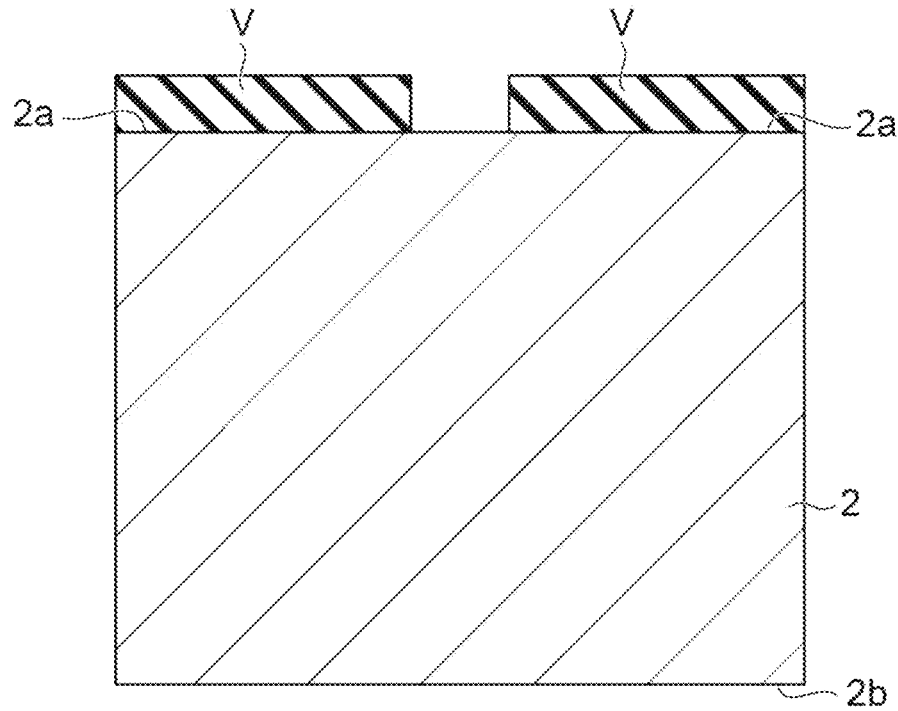
FIG. 2A is a flow chart showing an example of a manufacturing step of the semiconductor device.

In manufacturing the semiconductor device 1A, first, a processing step of forming the uneven structure K including the recessed portion 4 on the one surface 2a side of the semiconductor layer 2 is performed. In the processing step, first, as shown in FIG. 2A, the semiconductor layer 2 is prepared. Next, a resist V is patterned on the one surface 2a side of the semiconductor layer 2 in a region excluding a formation position of the recessed portion 4. For forming a pattern of the resist V, for example, an electron beam lithography device can be used. For a constituent material of the resist V, a non-chemical amplification positive type electron beam resist or the like can be used.

Figure 2B:
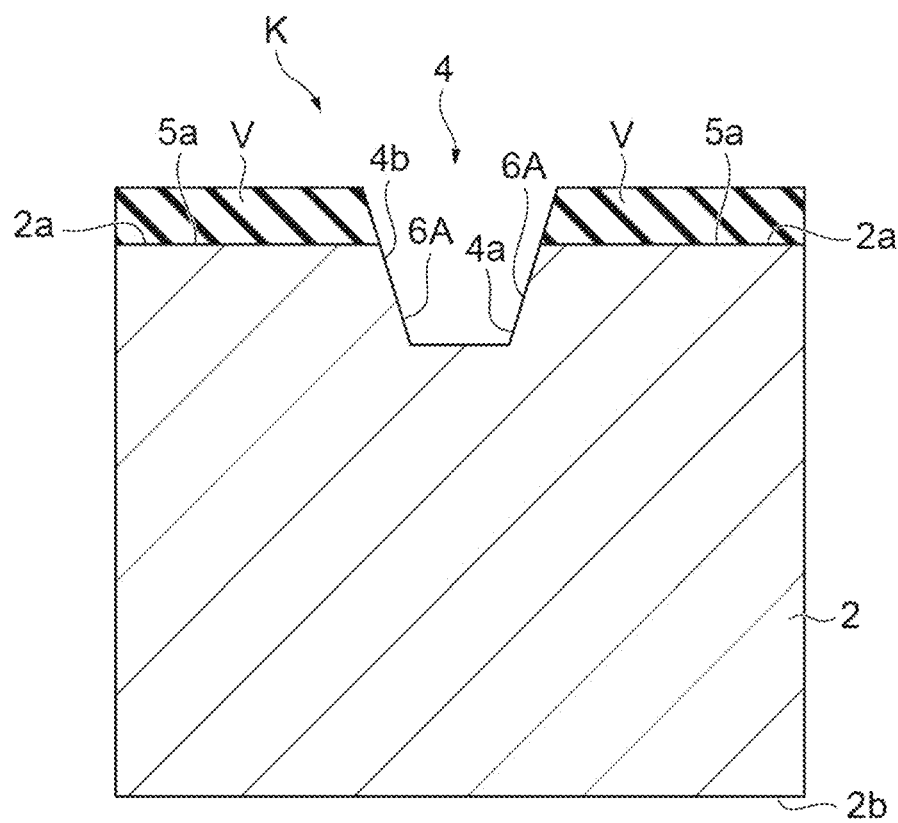
FIG. 2B is a flow chart showing an example of a step subsequent to FIG. 2A.

In the processing step, a first step performed by anisotropic etching and a second step including isotropic etching subsequent to the first step are performed. In the first step, the semiconductor layer 2 having the resist V formed on the one surface 2a side is disposed in an etching chamber, and isotropic etching such as reactive ion etching is performed to process the one surface 2a side of the semiconductor layer 2 to a predetermined depth. Thus, as shown in FIG. 2B, the opening portion 4b of the recessed portion 4 is formed on the one surface 2a side of the semiconductor layer 2, and the first inclined surface 6A that is continuous with the opening portion 4b is formed on the inner wall surface 4a of the recessed portion 4.

Figure 3A:
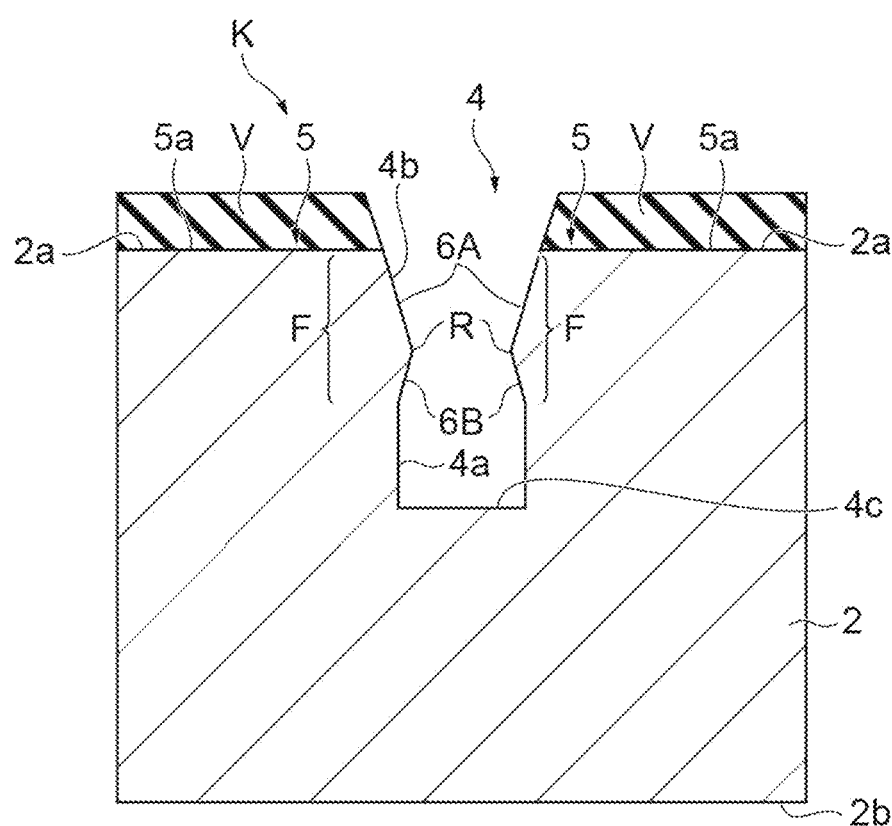
FIG. 3A is a flow chart showing an example of a step subsequent to FIG. 2B.

In the second step, etching including isotropic etching such as the Bosch process is performed in the etching chamber in which the first step has been performed, and the one surface 2a side of the semiconductor layer 2 is further deeply excavated. Thus, as shown in FIG. 3A, the second inclined surface 6B that is continuous with the first inclined surface 6A is formed, and the narrowed portion F is formed in the inner wall surface 4a of the recessed portion 4. After the narrowed portion F is formed, the recessed portion 4 is completed by digging the recessed portion 4 in a thickness direction of the semiconductor layer 2 to a predetermined depth, thereby forming the uneven structure K on the one surface 2a side of the semiconductor layer 2. After the recessed portion 4 is formed, the resist V on the one surface 2a side of the semiconductor layer 2 is removed.

Figure 3B:
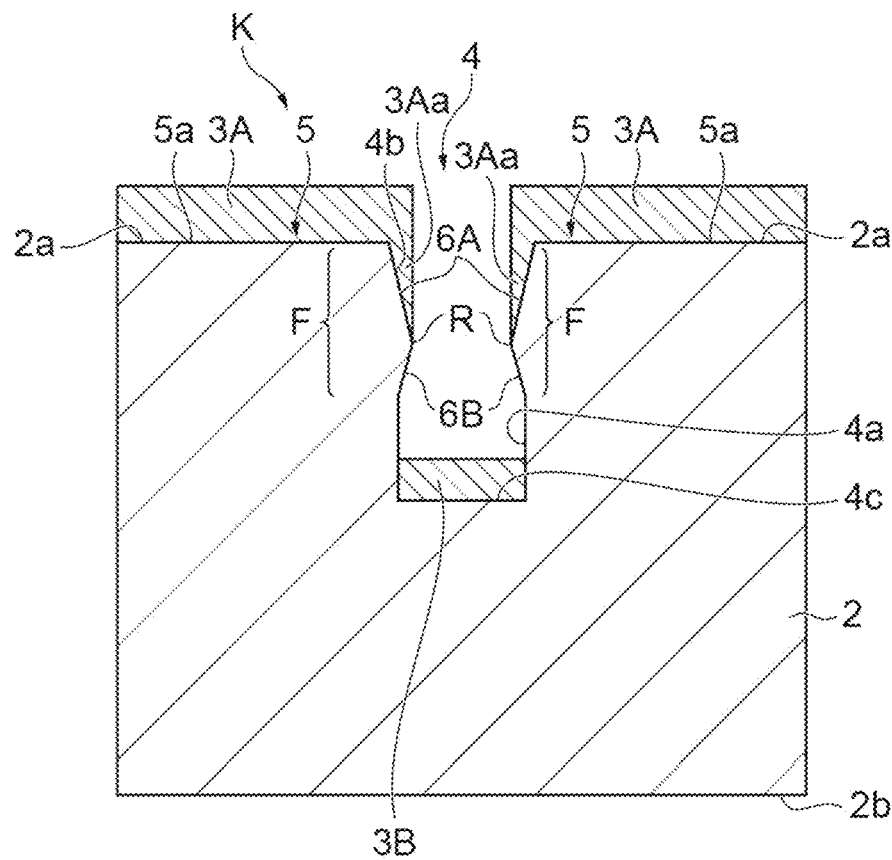
FIG. 3B is a flow chart showing an example of a step subsequent to FIG. 3A.

After the processing step is performed, a deposition step of performing film formation on the one surface 2a side of the semiconductor layer 2 by deposition is performed. In the deposition step, the semiconductor layer 2 having the recessed portion 4 formed therein is disposed in a deposition chamber, and vacuum deposition of a metal material is performed on the one surface 2a side of the semiconductor layer 2. Thus, as shown in FIG. 3B, the first electrode film 3A is formed on the one surface 2a of the semiconductor layer 2 (here, the top surface 5a of the protruding portion 5), and the second electrode film 3B is formed on the bottom surface 4c of the recessed portion 4. The extended portion 3Aa of the first electrode film 3A is formed on the first inclined surface 6A.

Figure 4A:
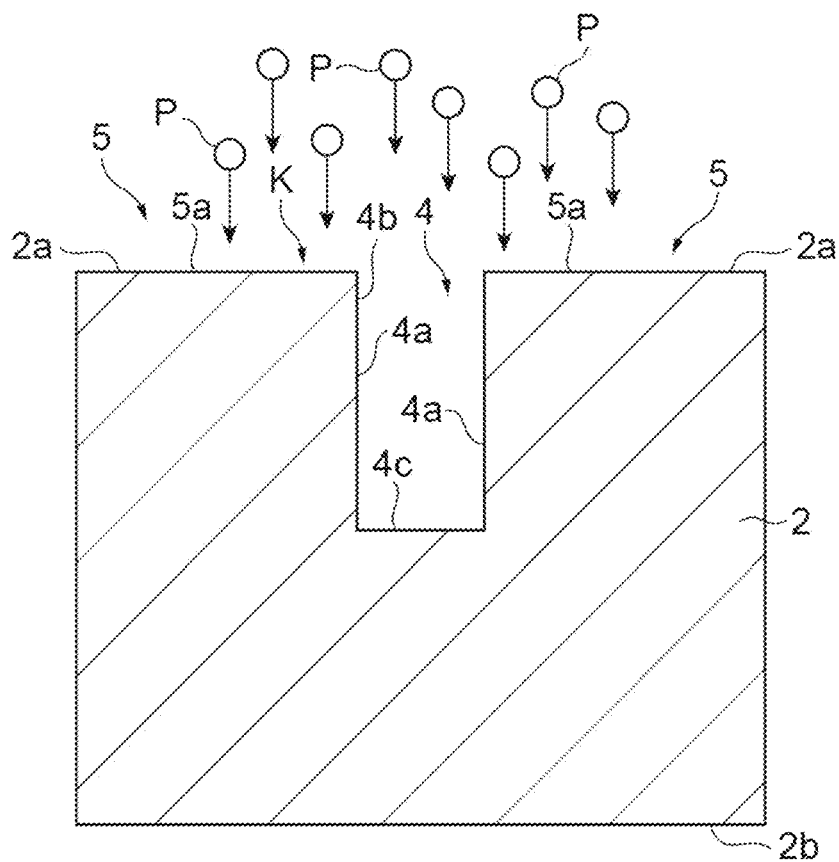
FIG. 4A is a schematic cross-sectional view showing a state of a deposition step for a semiconductor layer according to one aspect of a comparative example.
Figure 4B:
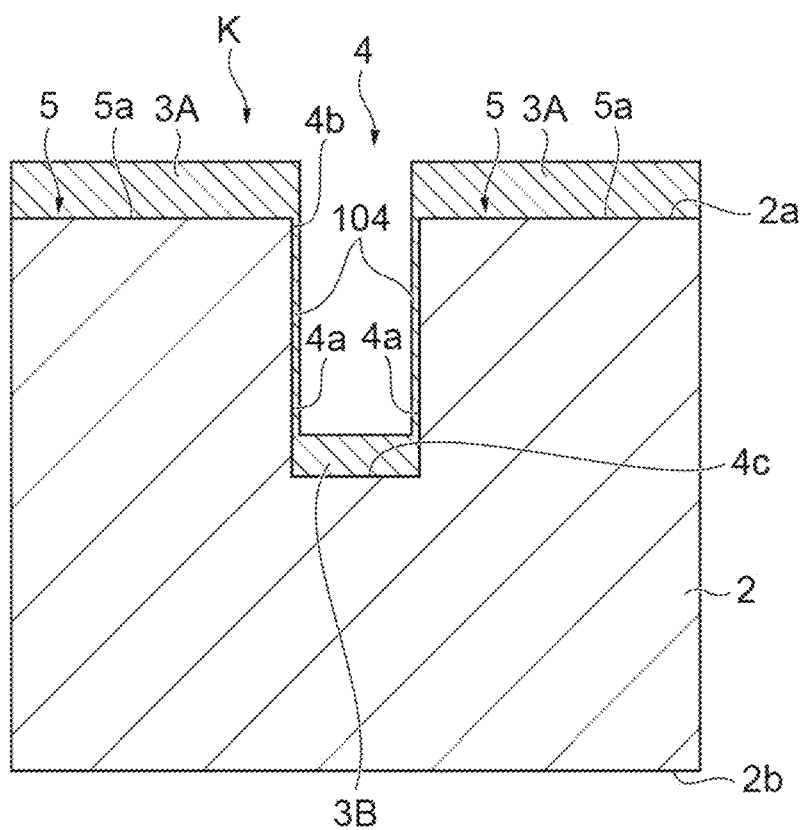
FIG. 4B is a schematic cross-sectional view showing a state of a deposition step for a semiconductor layer according to one aspect of a comparative example.

In performing the deposition step, as in a comparative example shown in FIG. 4A, in a configuration in which the narrowed portion F is not formed in the recessed portion 4, atoms P that enter the recessed portion 4 through the opening portion 4b may hit the inner wall surface 4a of the recessed portion 4 to some extent when the deposited films are formed. For this reason, it is conceivable that, as shown in FIG. 4B, a metal film 104 is also formed on the inner wall surface 4a of the recessed portion 4, and the first electrode film 3A on the one surface 2a of the semiconductor layer 2 and the second electrode film 3B on the bottom surface 4c of the recessed portion 4 are electrically connected to each other through the metal film 104.

Figure 5A:
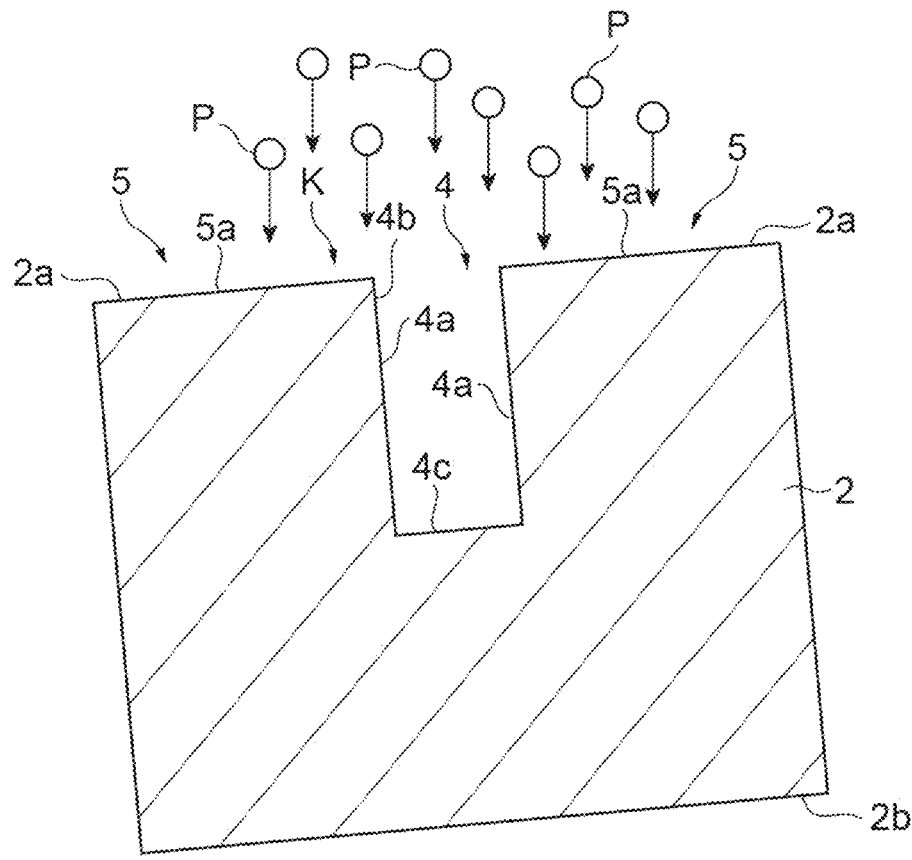
FIG. 5A is a schematic cross-sectional view showing a deposition step for a semiconductor layer according to another aspect of a comparative example.
Figure 5B:
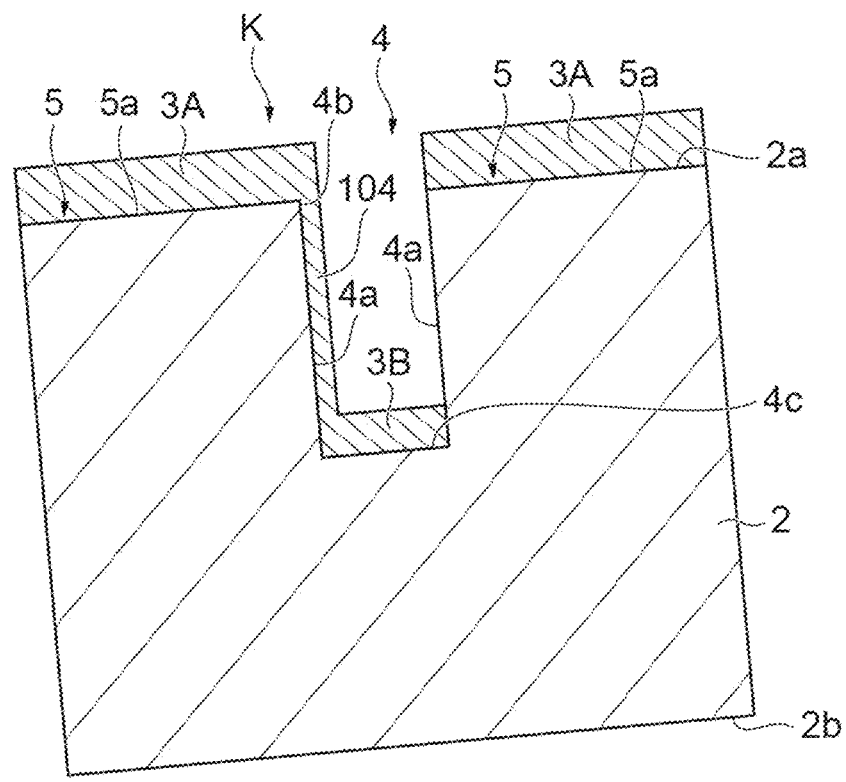
FIG. 5B is a schematic cross-sectional view showing a deposition step for a semiconductor layer according to another aspect of a comparative example.

Also, in general, the etching chamber and the deposition chamber are separate chambers, and when the deposition step is performed after the processing step, a step of transferring the semiconductor layer in which the recessed portion is formed to another chamber is required. For this reason, as shown in FIG. 5A, it is also assumed that a posture of the semiconductor layer 2 disposed in the deposition chamber is tilted with respect to a deposition head. In this case, it is conceivable that, as shown in FIG. 5B, the atoms P that enter the recessed portion 4 through the opening portion 4b are more likely to hit the inner wall surface 4a of the recessed portion 4, and the first electrode film 3A on the one surface 2a of the semiconductor layer 2 and the second electrode film 3B on the bottom surface 4c of the recessed portion 4 are easily connected to each other by the thicker metal film 104.

Figure 6A:
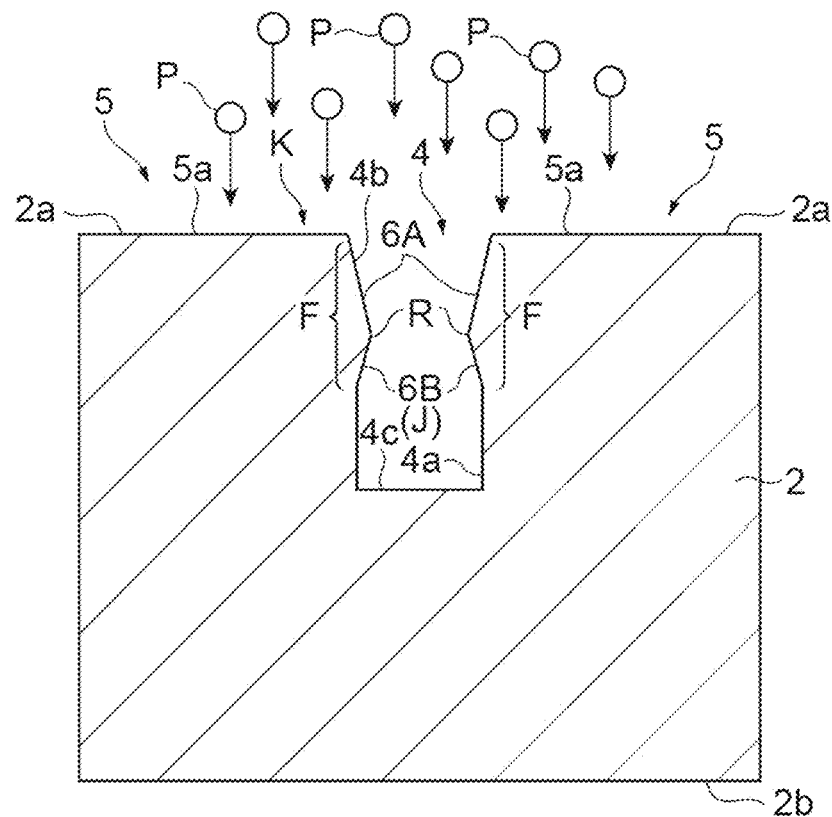
FIG. 6A is a schematic cross-sectional view showing a state of a deposition step for a semiconductor layer according to one aspect of an example.

On the other hand, in the method for manufacturing a semiconductor device 1A, the narrowed portion F is formed in the recessed portion 4 in the processing step. In the recessed portion 4 having the narrowed portion F, as shown in FIG. 6A, when the deposited films are formed, a portion that is not hit by the atoms P entering the recessed portion 4 through the opening portion 4b can be formed at the inner wall surface of the recessed portion. Here, in a plan view of the semiconductor layer 2, the second inclined surface 6B becomes the enlarged portion J having a cross-sectional area enlarged with respect to the portion on the opening portion 4b side of the recessed portion 4, and the second inclined surface 6B is in a state in which it cannot be seen from the one surface 2a side of the semiconductor layer 2. Accordingly, the second inclined surface 6B can function as the portion that is not hit by the atoms P.

Figure 6B:
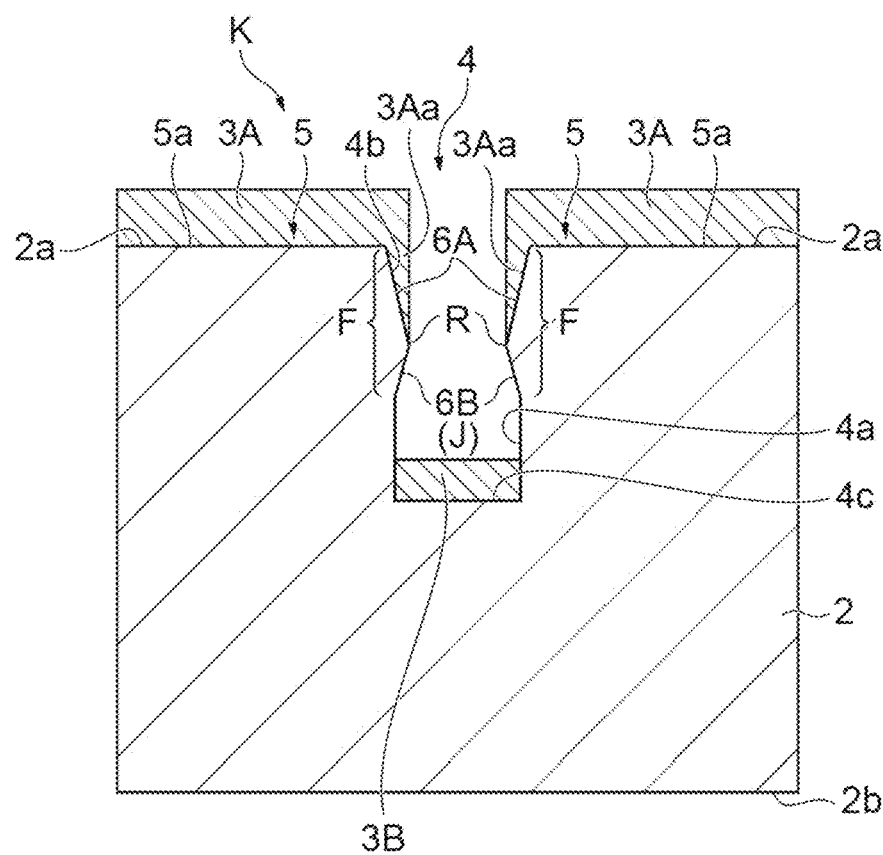
FIG. 6B is a schematic cross-sectional view showing a state of a deposition step for a semiconductor layer according to one aspect of the example.

As a result, as shown in FIG. 6B, a metal film is formed on the first inclined surface 6A and the first electrode film 3A extends into the recessed portion 4, but the tip of the extended portion 3Aa can be terminated at the boundary portion R between the first inclined surface 6A and the second inclined surface 6B. Accordingly, the first electrode film 3A on the one surface 2a of the semiconductor layer 2 and the second electrode film 3B on the bottom surface 4c of the recessed portion 4 can be appropriately separated from each other, and electrical connection between the two can be prevented.

Figure 7A:
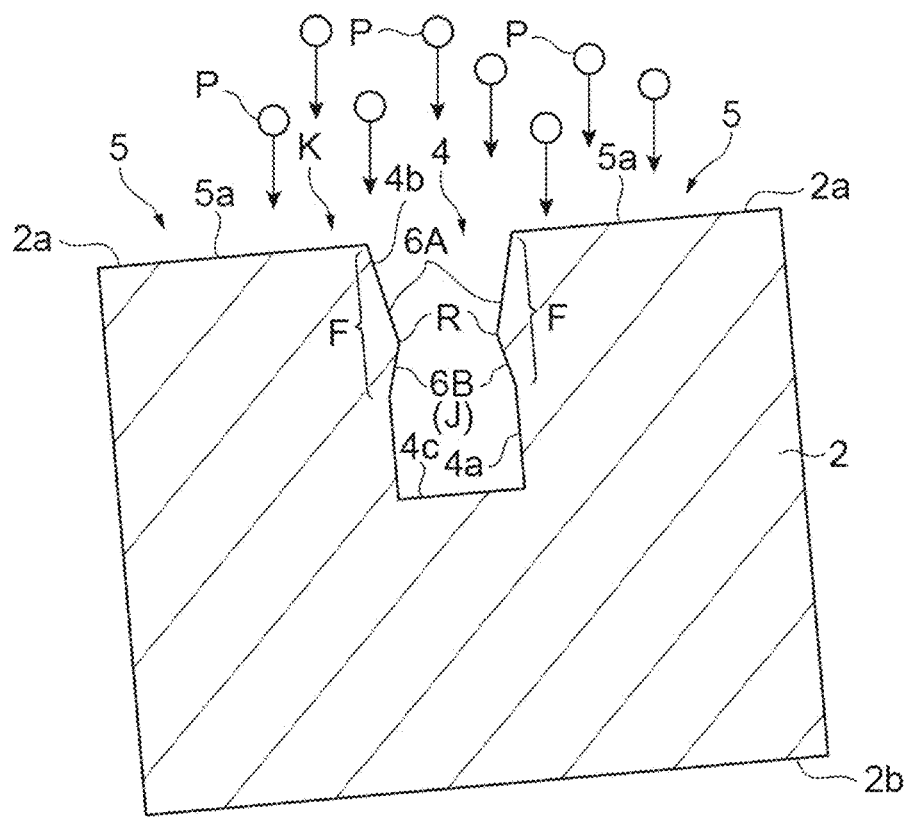
FIG. 7A is a schematic cross-sectional view showing a deposition step for a semiconductor layer according to another aspect of the example.
Figure 7B:
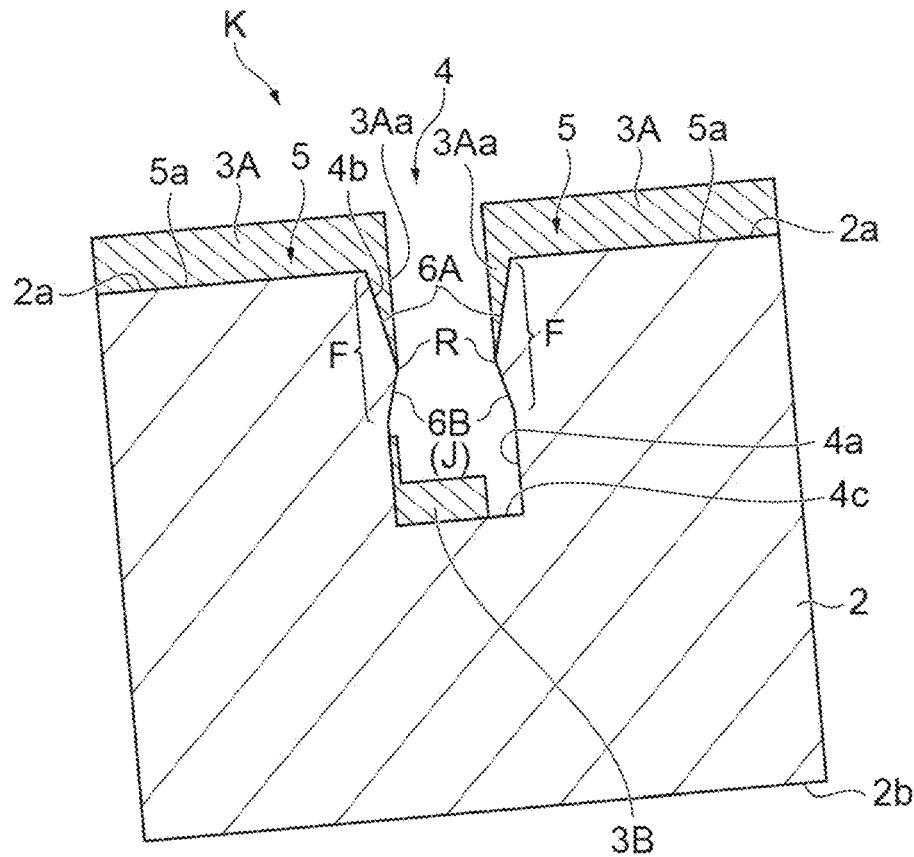
FIG. 7B is a schematic cross-sectional view showing a deposition step for a semiconductor layer according to another aspect of the example.

As shown in FIG. 7A, such an action of the narrowed portion F is also effective in a case in which the posture of the semiconductor layer 2 is tilted with respect to the deposition head. In this case, as shown in FIG. 7B, it is conceivable that the second electrode film 3B on the bottom surface 4c of the recessed portion 4 is biased to one side due to the inclination of the posture of the semiconductor layer 2. However, since the state in which the second inclined surface 6B cannot be seen from the one surface 2a side of the semiconductor layer 2 in a plan view of the semiconductor layer 2 can be maintained, the second inclined surface 6B can function as the portion that is not hit by the atoms P. Accordingly, as in the case of FIG. 6B, it is possible to separate the first electrode film 3A on the one surface 2a of the semiconductor layer 2 from the second electrode film 3B on the bottom surface 4c of the recessed portion 4, thereby preventing electrical connection between the two.

As described above, in the semiconductor device 1A, the enlarged portion J having a cross-sectional area enlarged with respect to the portion of the recessed portion 4 on the opening portion 4b side is formed in the recessed portion 4. In the semiconductor device 1A, in forming the enlarged portion J, the narrowed portion F is provided on the inner wall surface 4a of the recessed portion 4 to narrow the intermediate portion with respect to the opening portion 4b of the recessed portion 4. In the recessed portion 4 having the narrowed portion F, the cross-sectional area of the recessed portion 4 decreases once and then increases. Accordingly, when the deposited films are formed, the portion that is not hit by the atoms P entering the recessed portion 4 through the opening portion 4b can be formed on the inner wall surface 4a of the recessed portion 4. Accordingly, the first electrode film 3A provided on the top surface 5a of the protruding portion 5 and the second electrode film 3B provided on the bottom surface 4c of the recessed portion 4 can be appropriately separated from each other.

Further, in the case of forming the semiconductor device 1A serving as a vertical MSM photodetector as in the present embodiment, in separating the first electrode film 3A from the second electrode film 3B, a process of removing the metal film on the inner wall surface 4a of the recessed portion 4 using wet etching or the like can be omitted. Accordingly, it is not necessary to adjust film thicknesses of the first electrode film 3A and the second electrode film 3B, thereby simplifying the manufacturing process.

In the semiconductor device 1A, the narrowed portion F is configured of the first inclined surface 6A that gradually decreases the cross-sectional area of the recessed portion 4 toward the bottom surface 4c of the recessed portion 4, and the second inclined surface 6B that is continuous with the first inclined surface 6A and gradually increases the cross-sectional area of the recessed portion 4 toward the bottom surface 4c of the recessed portion 4. Thus, the second inclined surface 6B can function as a surface that is not hit by the atoms P entering the recessed portion 4 through the opening portion 4b. Accordingly, the first electrode film 3A provided on the top surface 5a of the protruding portion and the second electrode film 3B provided on the bottom surface 4c of the recessed portion 4 can be separated from each other more reliably.

In the semiconductor device 1A, the first inclined surface 6A is continuous with the opening portion 4b of the recessed portion 4. According to such a configuration, since the narrowed portion F is continuous with the opening portion 4b of the recessed portion 4, a separation position between the first electrode film 3A and the second electrode film 3B can be brought close to the opening portion 4b of the recessed portion 4. Thus, a distance between the first electrode film 3A and the second electrode film 3B is sufficiently secured, and the two are separated from each other more reliably. In particular, in a case in which the semiconductor device 1A is a surface incidence type (a type of light incidence from the one surface 2a side of the semiconductor layer 2), reflection loss can be inhibited by continuously changing a refractive index at the opening portion 4b.

In the semiconductor device 1A, the first deposited film and the second deposited film are both metal films and constitute the first electrode film 3A and the second electrode film 3B. Thus, the semiconductor device 1A is appropriately formed as an MSM photodetector.

In the method for manufacturing a semiconductor device according to the present embodiment, the processing step is performed by combining the first step performed by anisotropic etching and the second step performed by etching including isotropic etching subsequent thereto. In the anisotropic etching, the cross-sectional area of the recessed portion 4 formed is gradually narrowed as the process progresses. On the other hand, in the isotropic etching, the cross-sectional area of the recessed portion 4 gradually widens at the beginning of the process, and the enlarged portion J having a cross-sectional area enlarged with respect to the portion of the recessed portion 4 on the opening portion 4b side is formed in the recessed portion 4. After that, the recessed portion 4 can be formed to have a constant cross-sectional area.

Accordingly, the narrowed portion F that narrows the intermediate portion with respect to the opening portion 4b of the recessed portion 4 is formed in the inner wall surface 4a of the recessed portion 4 that is finally formed. Due to the narrowed portion F, the portion that is not hit by the atoms P entering the recessed portion 4 through the opening portion 4b can be formed on the inner wall surface 4a of the recessed portion 4 in the deposition step. Accordingly, the first electrode film 3A provided on the one surface 2a of the semiconductor layer 2 and the second electrode film 3B provided on the bottom surface 4c of the recessed portion 4 can be appropriately separated from each other.

In the present embodiment, in the first step of the processing step, the reactive ion etching is used as the anisotropic etching, and in the second step of the processing step, the Bosch process is used as the etching including isotropic etching. By combining the reactive ion etching and the Bosch process, the narrowed portion F can be formed easily and accurately.

Second Embodiment

Figure 8A:
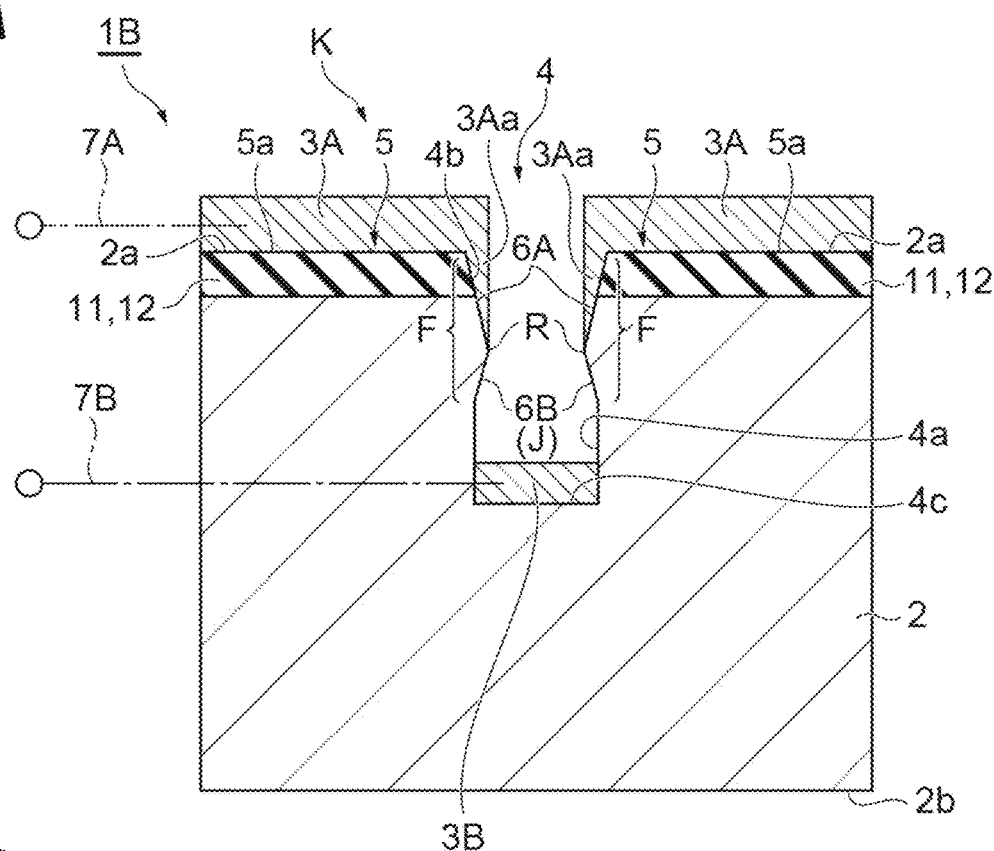
FIG. 8A is a schematic cross-sectional view showing a configuration of a semiconductor device according to a second embodiment of the present disclosure.
Figure 8B:
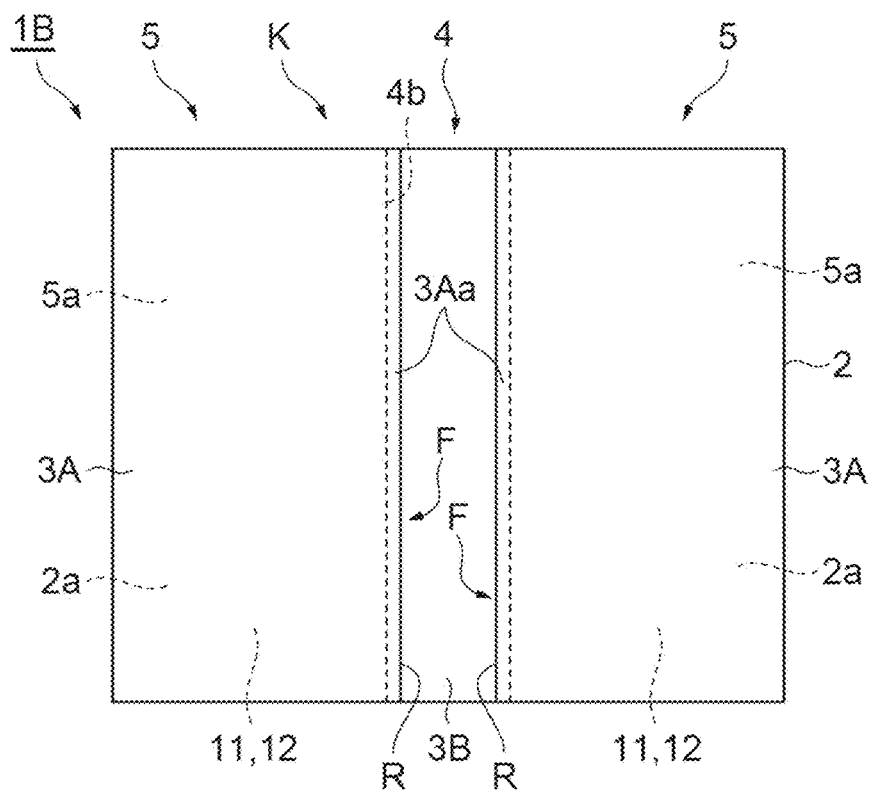
FIG. 8B is a plan view of FIG. 8A.

FIG. 8A is a schematic cross-sectional view showing a configuration of a semiconductor device according to a second embodiment of the present disclosure. FIG. 8B is a plan view thereof As shown in FIGS. 8A and 8B, a semiconductor device 1B according to the second embodiment is different from the semiconductor device 1A according to the first embodiment, in which an insulating film 11 is not provided, in that the insulating film 11 is provided between the metal film and the one surface 2a side of the semiconductor layer 2.

That is, in the semiconductor device 1B, the insulating film 11 is provided between the top surface 5a of the protruding portion 5 and the first electrode film 3A on the one surface 2a side of the semiconductor layer 2. For example, while the resist V used in the processing step (see FIG. 2A, and the like) is not removed after the processing step, the insulating film 11 can be formed by performing the deposition step in a state in which the resist V is left on the one surface 2a side of the semiconductor layer 2. Instead of the resist V, an inorganic material such as $SiO_2$ or SiN may be used for the insulating film. Further, instead of the insulating film 11, a dielectric film 12 may be provided between the metal film and the one surface 2a side of the semiconductor layer 2.

In the configuration of such a semiconductor device 1B, as in the first embodiment, the portion that is not hit by the atoms P entering the recessed portion 4 through the opening portion 4b can be formed on the inner wall surface 4a of the recessed portion 4 when the deposited films are formed. Accordingly, the first electrode film 3A provided on the top surface 5a of the protruding portion 5 and the second electrode film 3B provided on the bottom surface 4c of the recessed portion 4 can be appropriately separated from each other. Also, in the semiconductor device 1B, by disposing the insulating film 11 or the dielectric film 12 between the top surface 5a of the protruding portion 5 and the first electrode film 3A, a dark current in the Schottky junction of the first electrode film 3A can be inhibited. Accordingly, detection performance of the semiconductor device 1B serving as a photodetector can be enhanced.

Third Embodiment

Figure 9A:
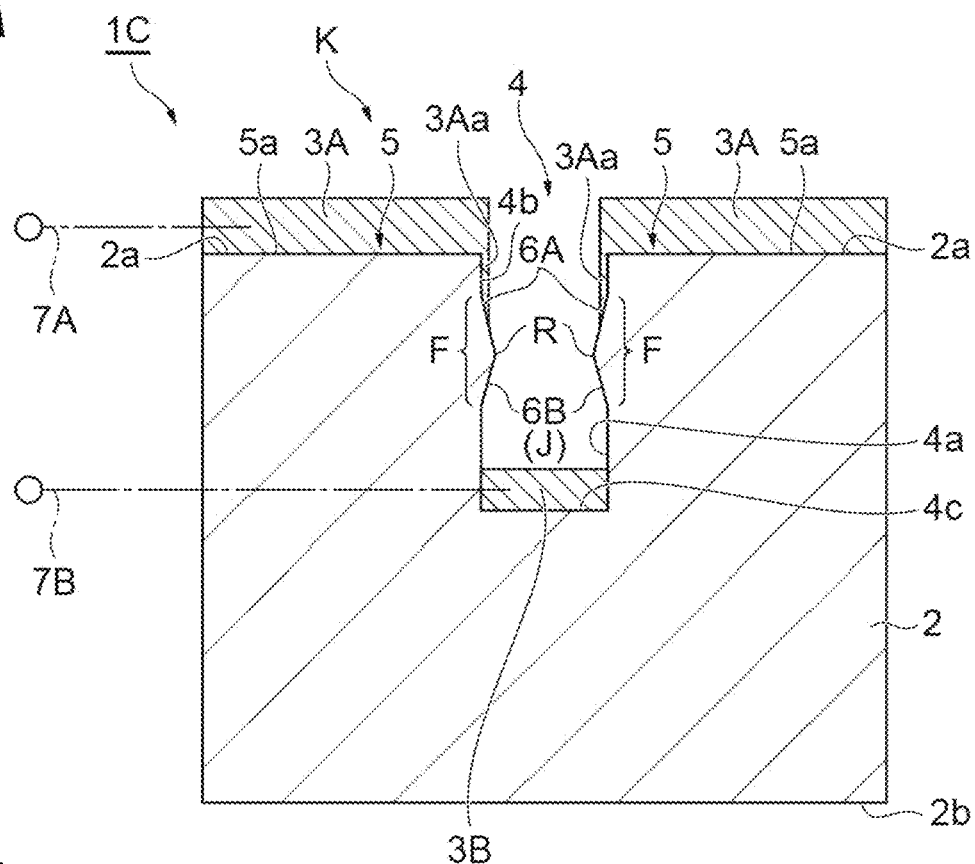
FIG. 9A is a schematic cross-sectional view showing a configuration of a semiconductor device according to a third embodiment of the present disclosure.
Figure 9B:
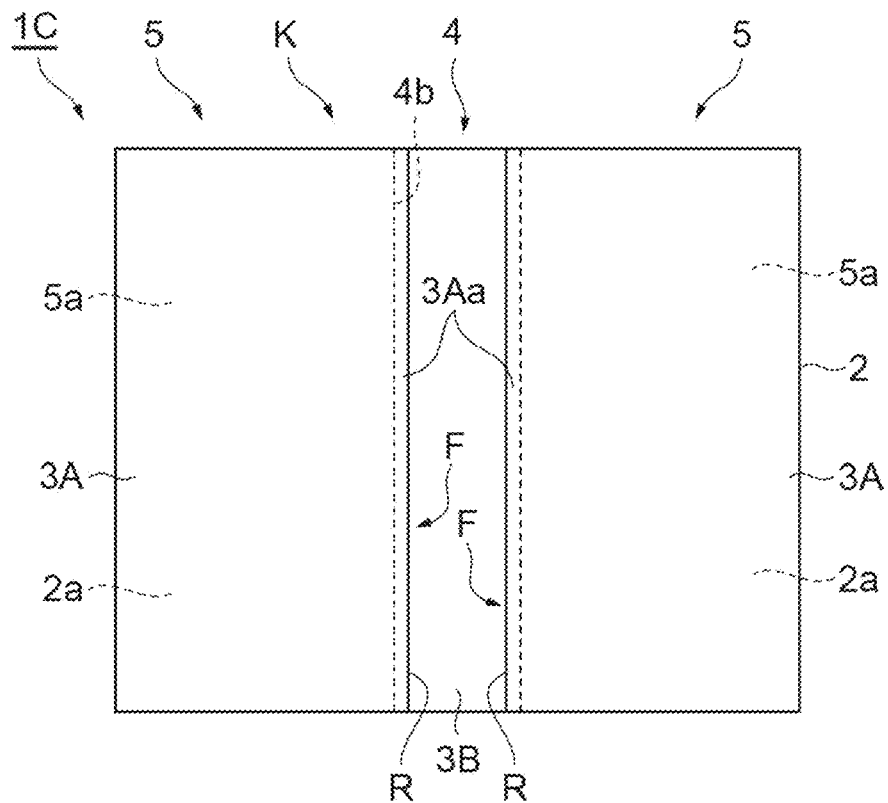
FIG. 9B is a plan view of FIG. 9A.

FIG. 9A is a schematic cross-sectional view showing a configuration of a semiconductor device according to a third embodiment of the present disclosure. FIG. 9B is a plan view thereof. As shown in FIGS. 9A and 9B, a semiconductor device 1C according to the third embodiment is different from the semiconductor device 1A according to the first embodiment, in which the first inclined surface 6A is continuous with the opening portion 4b of the recessed portion 4, in that the first inclined surface 6A is separated from the opening portion 4b of the recessed portion 4.

In the semiconductor device 1C, the cross-sectional area of the recessed portion 4 is constant from the opening portion 4b to a constant depth. The first inclined surface 6A and the second inclined surface 6B are located closer to the bottom surface 4c than a portion at which the cross-sectional area is constant, and the cross-sectional area is again constant between the second inclined surface 6B and the bottom surface 4c. In the case of forming such a recessed portion 4, in the processing step, first, the one surface 2a side of the semiconductor layer 2 is processed to a certain depth by anisotropic etching such as the Bosch process, and then the above-described first and second steps may be performed.

Also in the configuration of such a semiconductor device 1C, as in the first embodiment, the portion that is not hit by the atoms P entering the recessed portion 4 through the opening portion 4b can be formed on the inner wall surface 4a of the recessed portion 4 when the deposited films are formed. Accordingly, the first electrode film 3A provided on the top surface 5a of the protruding portion 5 and the second electrode film 3B provided on the bottom surface 4c of the recessed portion 4 can be appropriately separated from each other. Also, in the semiconductor device 1C, since the narrowed portion F is separated from the opening portion 4b of the recessed portion 4, the separation position between the first electrode film 3A and the second electrode film 3B can be kept away from the opening portion 4b of the recessed portion 4. Thus, particularly in a case in which the semiconductor device 1C is a back-illuminated type (a type of light incidence from the other surface 2b side of the semiconductor layer 2), back incident light that has passed through the second electrode film 3B can be reflected by the first electrode film 3A and directed toward the second electrode film 3B. Accordingly, light leakage from the opening portion 4b is inhibited, and improvement of light absorption efficiency is achieved.

Fourth Embodiment

Figure 10A:
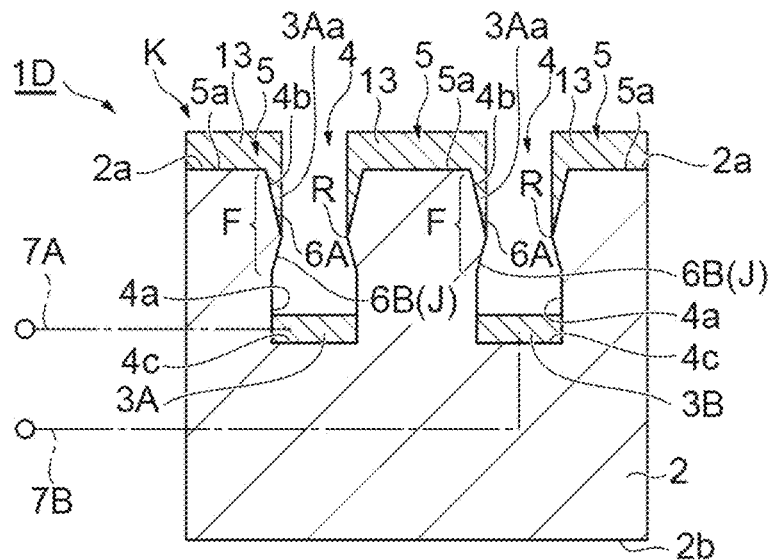
FIG. 10A is a schematic cross-sectional view showing a configuration of a semiconductor device according to a fourth embodiment of the present disclosure.
Figure 10B:
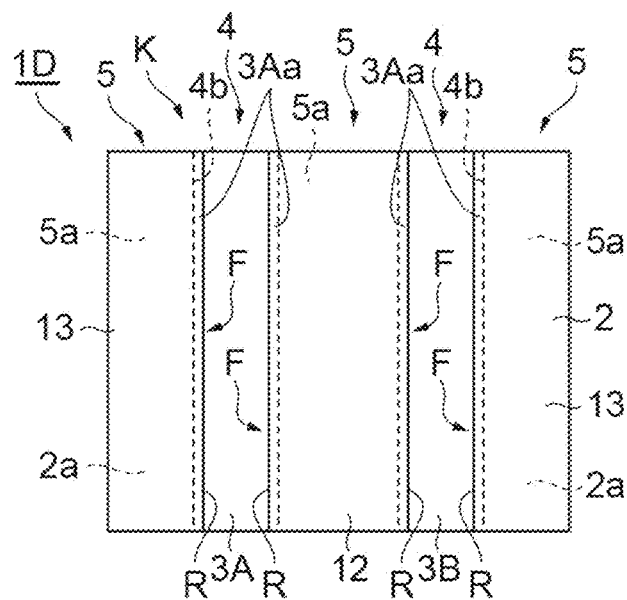
FIG. 10B is a plan view of FIG. 10A.

FIG. 10A is a schematic cross-sectional view showing a configuration of a semiconductor device according to a fourth embodiment of the present disclosure. FIG. 10B is a plan view thereof. As shown in FIGS. 10A and 10B, a semiconductor device 1D according to the fourth embodiment is different from the semiconductor device 1A according to the first embodiment, in which the single recessed portion 4 is provided in the uneven structure K per unit, in that a pair of recessed portions 4 are provided in the uneven structure K per unit.

The semiconductor device 1D is formed as, for example, a back-illuminated type lateral MSM photodetector. In the semiconductor device 1D, a metal film (second deposited film) provided on the bottom surface 4c of one recessed portion 4 constitutes the first electrode film 3A, and a metal film (second deposited film) provided on the bottom surface 4c of the other recessed portion 4 constitutes the second electrode film 3B. A metal film (first deposited film) on the top surface 5a of the protruding portion 5 functions as a reflective film 13.

Also in the configuration of such a semiconductor device 1D, as in the first embodiment, the portion that is not hit by the atoms P entering the recessed portion 4 through the opening portion 4b can be formed on the inner wall surface 4a of the recessed portion 4 when the deposited films are formed. Accordingly, the reflective film 13 provided on the top surface 5a of the protruding portion 5 and the first electrode film 3A and the second electrode film 3B provided on the bottom surface 4c of the recessed portion 4 can be appropriately separated from each other. Further, in the semiconductor device 1D, a component of incident light incident on the back surface that has passed through the first electrode film 3A and the second electrode film 3B can be reflected by the reflective film 13 and caused to be incident on the first electrode film 3A and the second electrode film 3B. Accordingly, detection performance of the semiconductor device 1D serving as a photodetector can be enhanced.

Figure 10C:
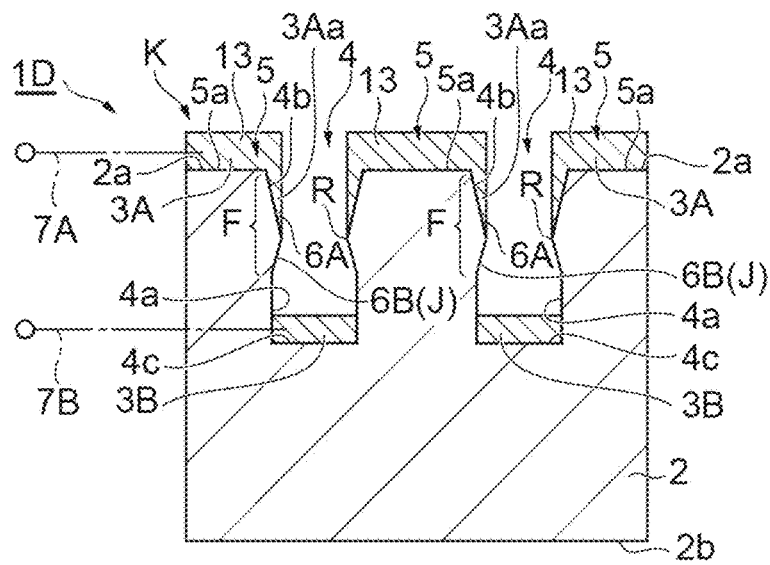
FIG. 10C is a schematic cross-sectional view showing a modified example of FIG. 10A.

The semiconductor device 1D can also be formed as, for example, a back-illuminated type vertical MSM photodetector. In this case, for example, as shown in FIG. 10C, the metal film (first deposited film) on the top surface 5a of the protruding portion 5 may be caused to function as the first electrode film 3A, the metal film (second deposited film) provided on the bottom surface 4c of the recessed portion 4 may be caused to function as the second electrode film 3B, and the metal film (first deposited film) on the top surface 5a of the protruding portion 5 located between the recessed portion 4 and 4 may be caused to function as the reflective film 13.

Fifth Embodiment

Figure 11A:
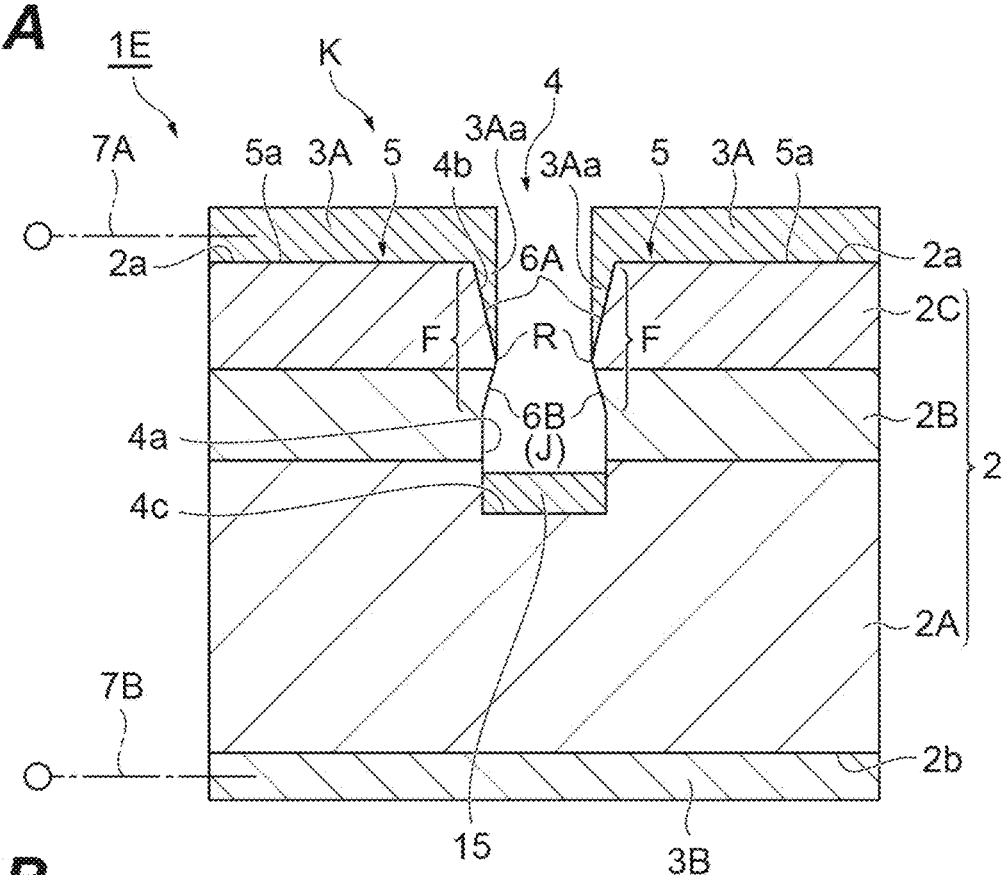
FIG. 11A is a schematic cross-sectional view showing a configuration of a semiconductor device according to a fifth embodiment of the present disclosure.
Figure 11B:
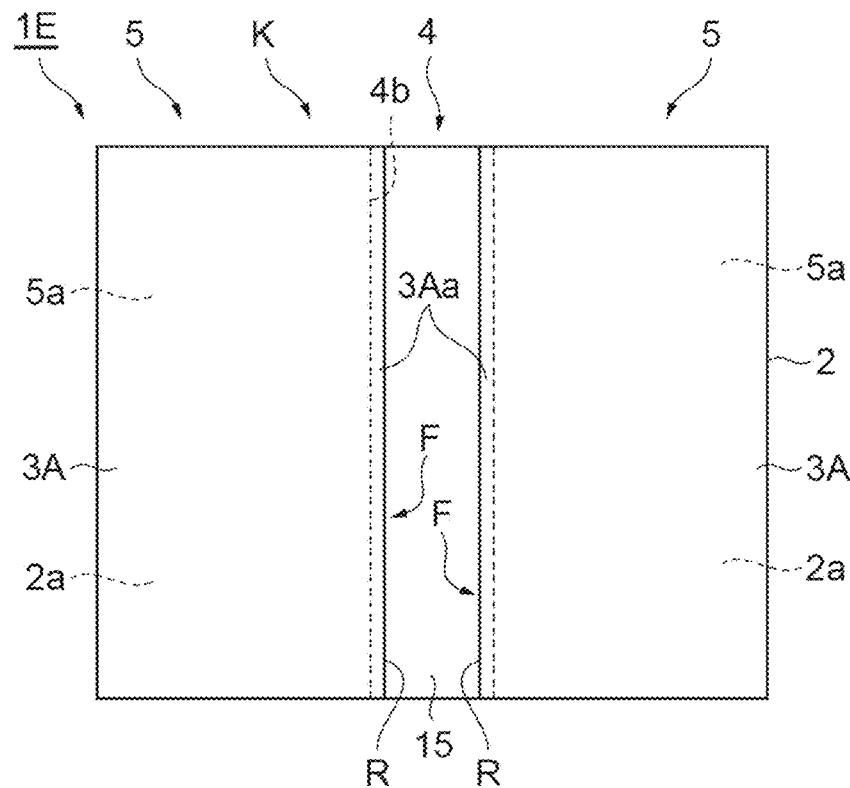
FIG. 11B is a plan view of FIG. 11A.

FIG. 11A is a schematic cross-sectional view showing a configuration of a semiconductor device according to a fifth embodiment of the present disclosure. FIG. 11B is a plan view thereof. A semiconductor device 1E shown in FIGS. 11A and 11B is formed as a back-illuminated type photodetector using a near-field excitation effect.

In the semiconductor device 1E, in a case in which light with a wavelength longer than a absorption edge wavelength (a wavelength having bandgap energy) of a semiconductor is incident as incident light, surface plasmons are excited by the incident light. By utilizing a localized non-uniform electric field generated by resonance of the surface plasmons, direct optical transition in the semiconductor is possible, and sufficient light absorption can occur in the semiconductor. In the semiconductor device 1E, the light absorption occurring in the semiconductor is taken out as a photocurrent to the outside, so that detection of the light with the wavelength longer than the absorption edge wavelength of the semiconductor can be realized.

In the semiconductor device 1E, the semiconductor layer 2 has a first layer 2A of n type conductivity (a first conductivity type semiconductor layer), a second layer 2B of p-type conductivity (a second conductivity type semiconductor layer), and a third layer 2C of p+ type conductivity (a second conductivity type semiconductor layer). The first layer 2A is located on the other surface $2b$ side of the semiconductor layer 2, and the third layer 2C is located on the one surface $2a$ side of the semiconductor layer 2. The second layer 2B is located between the first layer 2A and the second layer 2B. A semiconductor pn junction is formed at an interface between the first layer 2A and the second layer 2B.

The configuration of the recessed portion 4 formed on the one surface $2a$ side of the semiconductor layer 2 is the same as in the first embodiment. The recessed portion 4 penetrates the third layer 2C and the second layer 2B and extends into the first layer 2A. The narrowed portion F of the recessed portion 4 is located in the second conductivity type semiconductor layer. In the example of FIG. 11A, the boundary portion R between the first inclined surface 6A and the second inclined surface 6B is located in the third layer 2C. Thus, the extended portion 3Aa of the first electrode film 3A located on the first inclined surface 6A is configured not to come into contact with the first layer 2A. As long as the extended portion 3Aa does not come into contact with the first layer 2A, the boundary portion R between the first inclined surface 6A and the second inclined surface 6B may be located on the second layer 2B.

In the semiconductor device 1E, the metal film (first deposited film) provided on the top surface $5a$ of the protruding portion 5 in the uneven structure K constitutes the first electrode film 3A, and the metal film provided on the other surface $2b$ side of the semiconductor layer 2 constitutes the second electrode film 3B. The first electrode film 3A functions as one contact electrode of the pn junction. The metal film (second deposited film) provided on the bottom surface $4c$ of the recessed portion 4 in the uneven structure K functions as a near-field excitation source 15.

The near-field excitation source 15 is a metal nanostructure that generates the surface plasmons near an interface between the near-field excitation source 15 and the semiconductor layer 2 in accordance with the incidence of incident light. The near-field excitation source 15 is provided with a width equal to or less than a wavelength of the incident light to be in contact with the first layer 2A. Thus, a generation position of the localized non-uniform electric field and a position of a depletion layer in the semiconductor layer 2 can be caused to coincide with each other or brought close to each other, and the effect of the localized non-uniform electric field can be fully exhibited.

In the configuration of such a semiconductor device 1E, as in the first embodiment, the portion that is not hit by the atoms P entering the recessed portion 4 through the opening portion $4b$ can be formed on the inner wall surface $4a$ of the recessed portion 4 when the deposited films are formed. Accordingly, the first electrode film 3A provided on the top surface $5a$ of the protruding portion 5 and the near-field excitation source provided on the bottom surface $4c$ of the recessed portion 4 can be appropriately separated from each other. Due to the reliable separation between the first electrode film 3A and the near-field excitation source 15, the near-field excitation source 15 does not contribute to extraction of photocurrent and has only the function of forming a localized non-uniform electric field. Accordingly, as compared to the case in which the first electrode film 3A and the first layer 2A are in contact with each other, or the near-field excitation source 15 itself serves as a photocurrent extraction electrode, generation of a dark current due to the Schottky junction can be inhibited.

Also, in the present embodiment, the extended portion 3Aa of the first electrode film 3A is located on the first inclined surface 6A in the narrowed portion F. The extended portion 3Aa can enhance a scattering effect of incident light. By enhancing the scattering effect of incident light, absorptivity of broadband light is enhanced, and a detection band of the photodetector can be widened. In addition, since an opening width of the recessed portion 4 is narrower than a width of the near-field excitation source 15 in a formation region of the extended portion 3Aa, a new surface plasmon resonance mode can be formed. Thus, a new absorption band of light can be obtained and a photodetector with multiple detection bands can be constructed. Further, spatial non-uniformity of the localized non-uniform electric field caused by the incidence of incident light becomes more conspicuous, and the near-field excitation effect is improved.

Sixth Embodiment

Figure 12A:
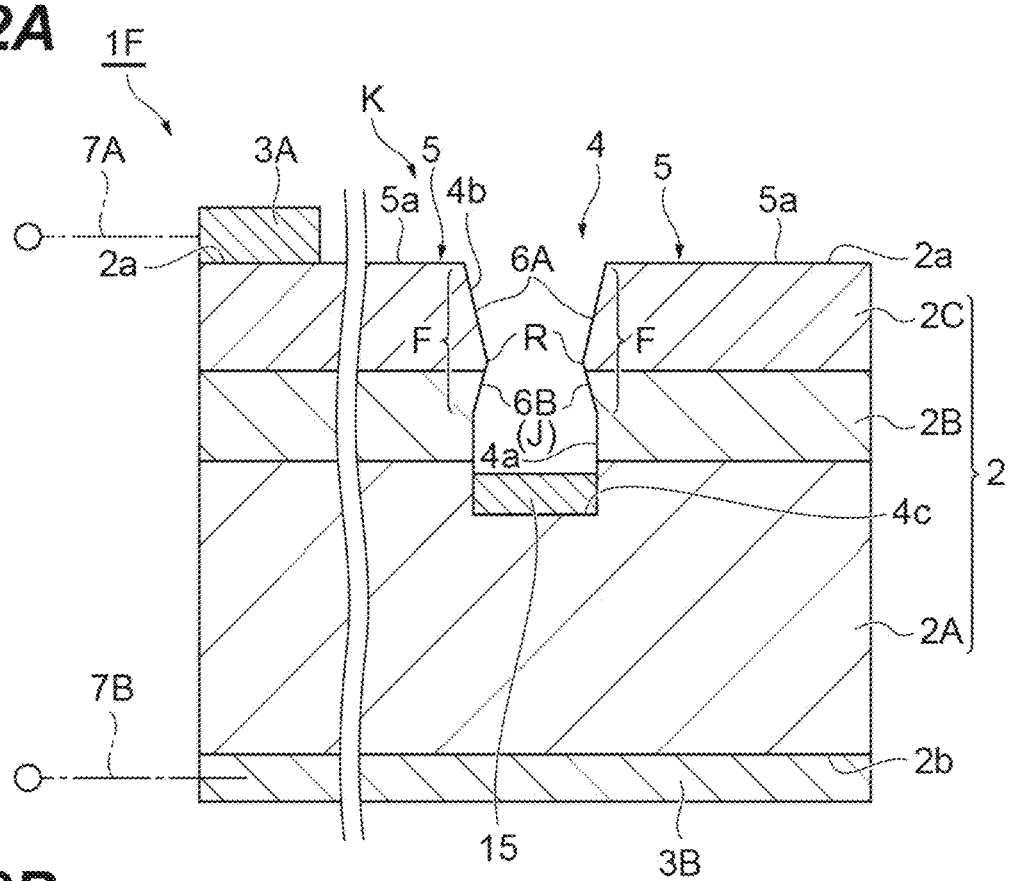
FIG. 12A is a schematic cross-sectional view showing a configuration of a semiconductor device according to a sixth embodiment of the present disclosure.
Figure 12B:
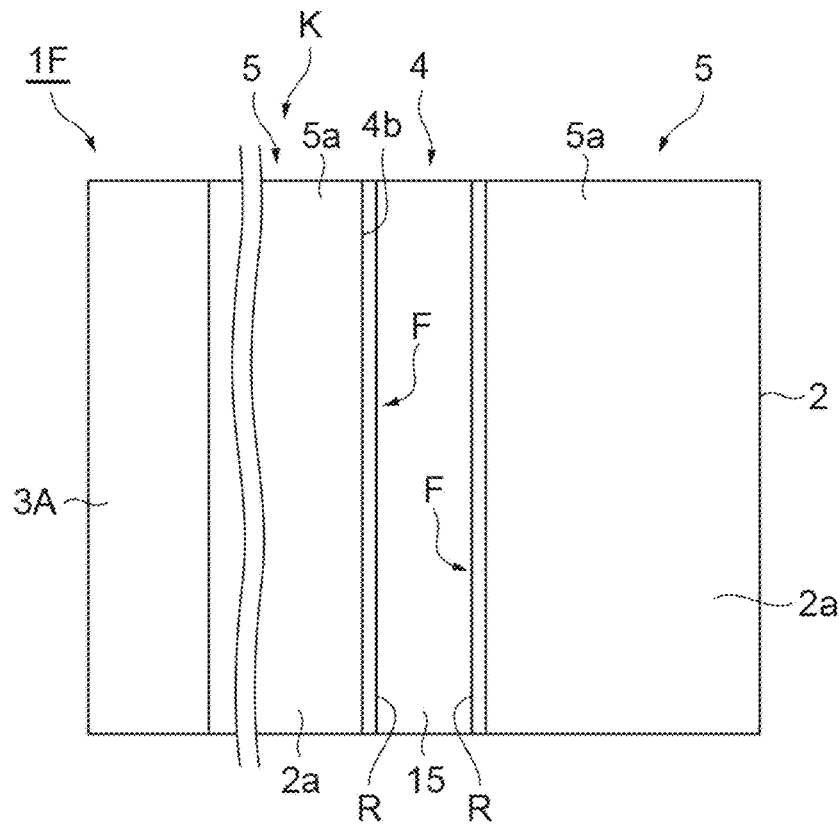
FIG. 12B is a plan view of FIG. 12A.

FIG. 12A is a schematic cross-sectional view showing a configuration of a semiconductor device according to a sixth embodiment of the present disclosure. FIG. 12B is a plan view thereof. As in the fifth embodiment, a semiconductor device 1F shown in FIGS. 12A and 12B is formed as a photodetector using the near-field excitation effect. The semiconductor device 1F is different from the semiconductor device 1E according to the fifth embodiment in that no metal film is formed on the top surfaces $5a$ of the protruding portion 5 in the uneven structure K.

In the semiconductor device 1F, instead of the configuration of the first electrode film 3A formed on the top surface $5a$ of the protruding portion 5, the first electrode film 3A is formed on the one surface $2a$ side of the semiconductor layer 2 at a position separated from the uneven structure K. In the example of FIGS. 12A and 12B, the first electrode film 3A is formed in a rectangular shape on the one surface $2a$ side of the semiconductor layer 2 at one edge portion of the recessed portion 4 in a direction orthogonal to the extending direction. The semiconductor device 1F, like the semiconductor device 1E, can be formed as a photodetector using the near-field excitation effect. The semiconductor device 1F has no restrictions on an incident direction of incident light, and can be adapted to both front surface incidence and rear surface incidence.

In the configuration of such a semiconductor device 1F, as in the first embodiment, the portion that is not hit by the atoms P entering the recessed portion 4 through the opening portion $4b$ can be formed on the inner wall surface $4a$ of the recessed portion 4 when the deposited films are formed. Accordingly, the first electrode film 3A provided on the one surface $2a$ side of the semiconductor layer 2 and the near-field excitation source 15 provided on the bottom surface $4c$ of the recessed portion 4 can be appropriately separated from each other. Due to the reliable separation between the first electrode film 3A and the near-field excitation source 15, the near-field excitation source 15 does not contribute to extraction of photocurrent and has only the function of forming a localized non-uniform electric field. Accordingly, as compared to the case in which the first electrode film 3A and the first layer 2A are in contact with each other, or the case in which the near-field excitation source 15 itself serves as a photocurrent extraction electrode, generation of a dark current due to the Schottky junction can be inhibited.

Modified Example

Figure 13A:
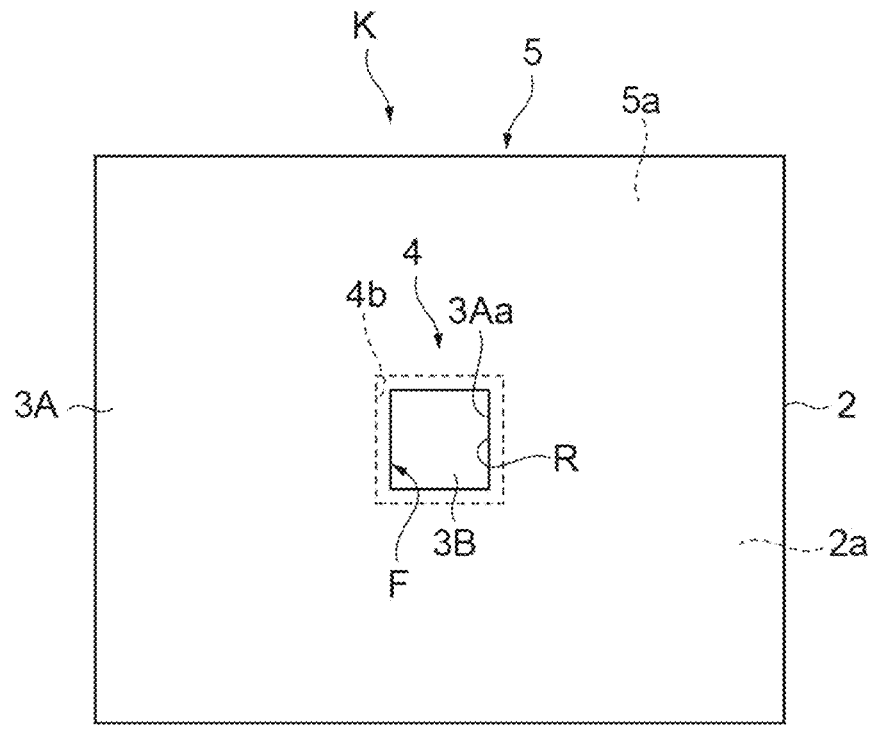
FIG. 13A is a schematic plan view showing a modified aspect of a recessed portion.
Figure 13B:
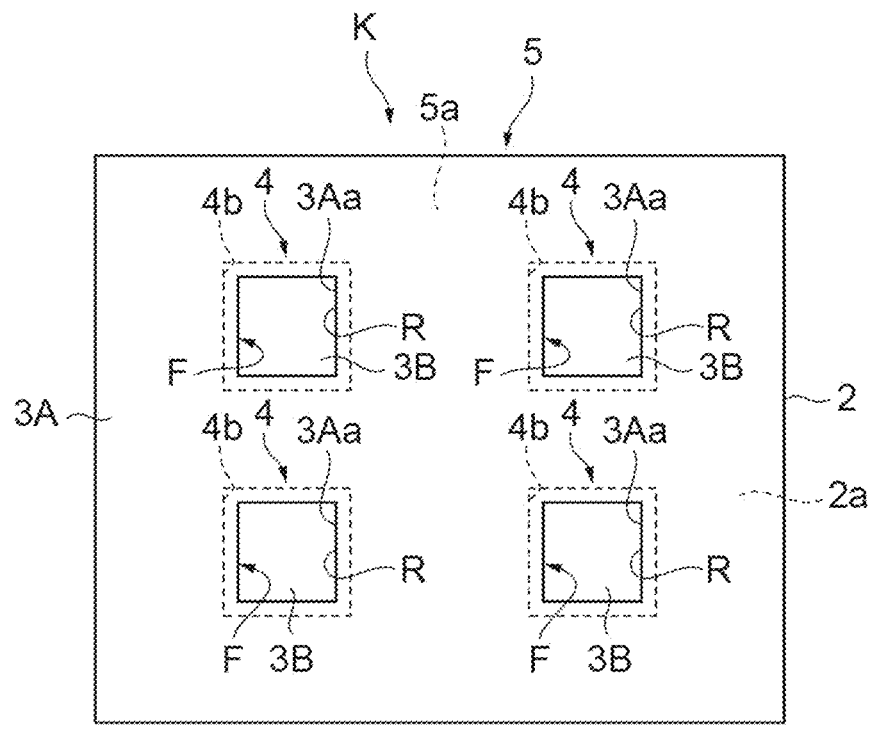
FIG. 13B is a schematic plan view showing a modified aspect of a recessed portion.

The present disclosure is not limited to the above embodiments. For example, in each of the above embodiments, the recessed portion 4 is provided linearly from one side to the other side of the one surface 2a side of the semiconductor layer 2 in a plan view of the semiconductor layer 2, a planar shape of the recessed portion 4 is not limited thereto. For example, as shown in FIG. 13A, the planar shape of the recessed portion 4 may be a square shape. The planar shape of the recessed portion 4 is not limited to a square shape and may be other shapes such as a rectangular shape, a polygonal shape, a circular shape, and an elliptical shape. Also, for example, as shown in FIG. 13B, recessed portions 4 may be disposed in a grid pattern in an in-plane direction of the one surface 2a of the semiconductor layer 2. An arrangement pattern of the recessed portions 4 is not limited to the grid pattern shown in FIG. 13B and may be other patterns such as annular, concentric, zigzag, and random patterns.

Figure 14A:
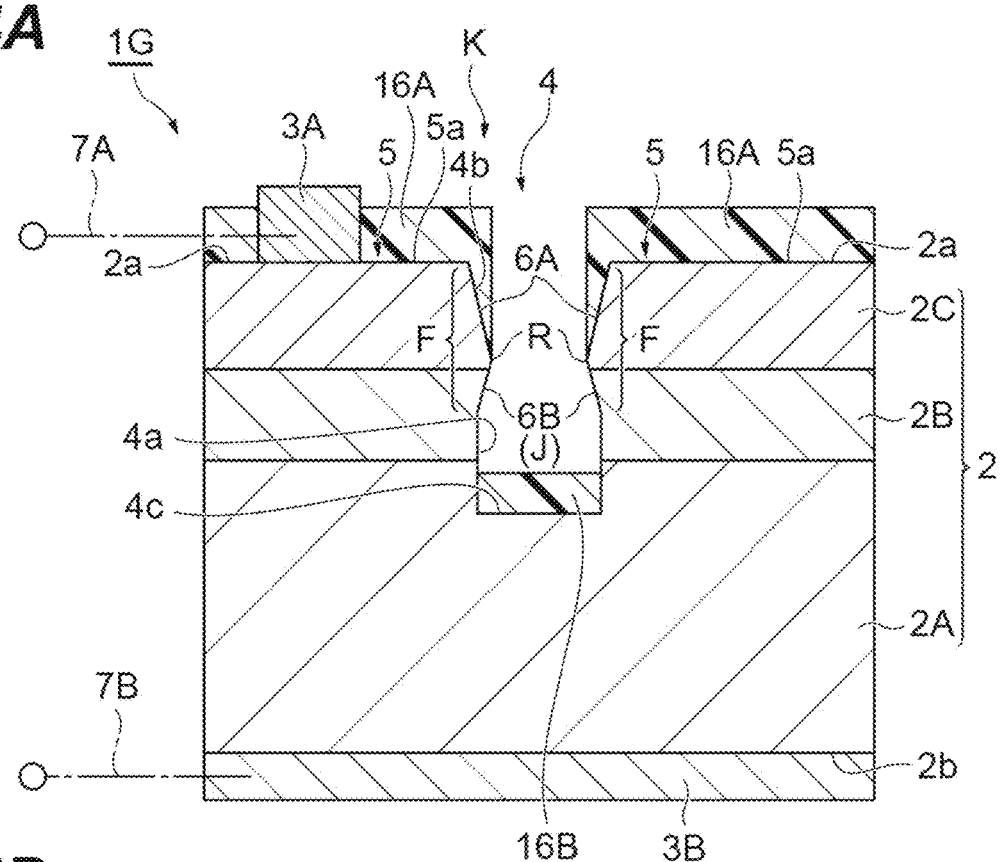
FIG. 14A is a schematic cross-sectional view showing a configuration of a semiconductor device according to a modified example of the present disclosure.
Figure 14B:
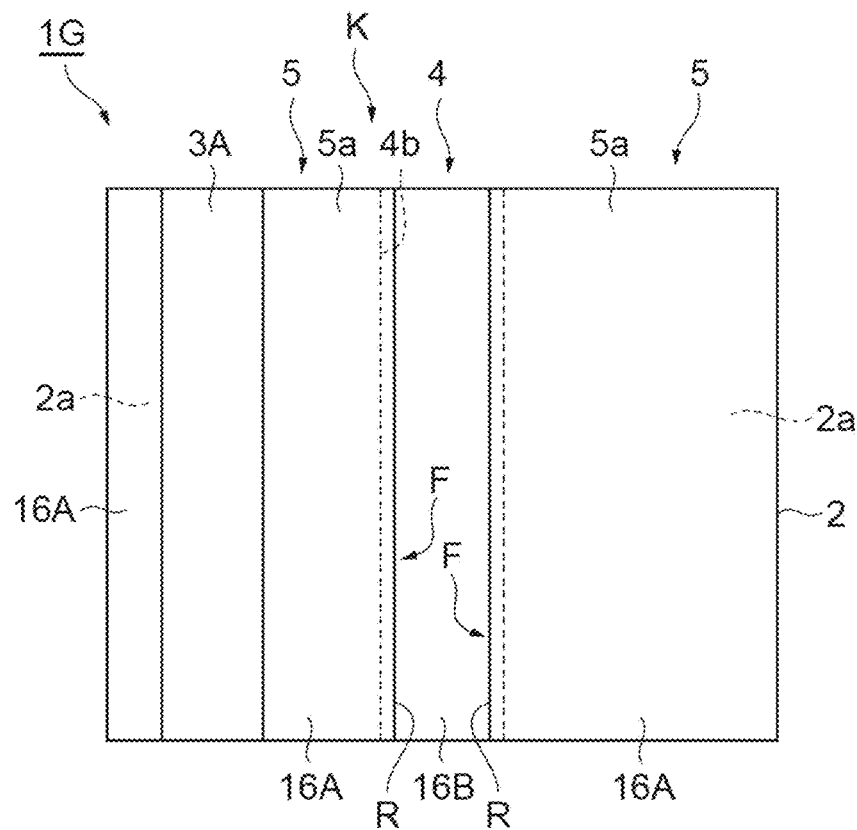
FIG. 14B is a plan view of FIG. 14A.

In each of the above embodiments, both the first deposited film and the second deposited film are metal films, but the first deposited film and the second deposited film are not limited to metal films and may be films made of materials other than metals, such as resin films. For example, as in a semiconductor device 1G shown in FIGS. 14A and 14B, a first dielectric film 16A that is the first deposited film may be formed on the top surface 5a of the protruding portion 5, and a second dielectric film 16B that is the second deposited film may be formed on the bottom surface 4c of the recessed portion 4. In the semiconductor device 1G, the first electrode film 3A is formed on a portion of the top surface 5a of the protruding portion 5, and the second electrode film 3B is formed on the other surface 2b of the semiconductor layer 2 side.

Such a semiconductor device 1G, like the semiconductor device 1E, can be formed as, for example, a photodetector using the near-field excitation effect. The second dielectric film 16B on the bottom surface 4c of the recessed portion 4 serves as a scatterer that generates wavenumber components, as in the case of the metal film. Since the second dielectric film 16B serves as a scatterer, a near-field is generated near an interface with the semiconductor layer 2, and a near-field excitation effect can be generated.

In each of the above-described embodiments, the narrowed portion F that narrows the intermediate portion with respect to the opening portion 4b of the recessed portion 4 is provided, but the enlarged portion J having a cross-sectional area enlarged with respect to the portion of the recessed portion 4 on the opening portion 4b side does not necessarily have to be formed by the narrowed portion F. For example, a configuration may be adopted in which only the inclined surface corresponding to the second inclined surface 6B is provided in the recessed portion 4, and the cross-sectional area of the opening portion 4b is maintained from the opening portion 4b of the recessed portion 4 to the portion corresponding to the second inclined surface 6B.

In each of the above embodiments, a photodetector is exemplified as an application of the semiconductor device, but the semiconductor device according to the present disclosure can be applied to other applications. Other applications of the semiconductor device include a Surface-Enhanced Raman Spectroscopy (SERS) substrate. The SERS substrate is a substrate that amplifies an intensity of weak Raman scattered light and can be used for Raman spectroscopic analysis and the like.

For example, in a case in which the semiconductor device 1A shown in FIGS. 1A and 1B is used as a SERS substrate, the metal film (portion corresponding to the extended portion 3Aa of first electrode film 3A in the semiconductor device 1A) located on the first inclined surface 6A forming the narrowed portion F enhances surface Raman scattering. In addition, since the metal film on the top surface 5a of the protruding portion 5 and the metal film on the bottom surface 4c of the recessed portion 4 are separated from each other by the narrowed portion F, a gap between the metal films can be reduced by adjusting thicknesses of the metal films. The gap can act as a hotspot (surface Raman scattering) in the SERS substrate.

What is claimed is:

1. A semiconductor device comprising:
   a semiconductor layer having an uneven structure configured to include a recessed portion on one surface side thereof;
   a first deposited film provided on the one surface of the semiconductor layer; and
   a second deposited film provided on a bottom surface of the recessed portion,
   wherein the recessed portion is provided with an enlarged portion having a cross-sectional area enlarged with respect to a portion on an opening portion side of the recessed portion, and
   wherein a starting position of the enlarged portion is positioned between the opening portion of the recessed portion and the bottom surface of the recessed portion in a depth direction of the recessed portion.

2. The semiconductor device according to claim 1, wherein an inner wall surface of the recessed portion is provided with a narrowed portion formed by narrowing an intermediate portion with respect to the opening portion of the recessed portion.

3. The semiconductor device according to claim 2, wherein the narrowed portion is configured of a first inclined surface that gradually decreases a cross-sectional area of the recessed portion toward the bottom surface of the recessed portion, and a second inclined surface that is continuous with the first inclined surface and gradually increases the cross-sectional area of the recessed portion toward the bottom surface of the recessed portion.

4. The semiconductor device according to claim 3, wherein the first inclined surface is continuous with the opening portion of the recessed portion.

5. The semiconductor device according to claim 3, wherein the first inclined surface is separated from the opening portion of the recessed portion.

6. The semiconductor device according to claim 1, wherein the first deposited film and the second deposited film are metal films.

7. The semiconductor device according to claim 6, wherein, on the one surface side of the semiconductor layer, an insulating film or dielectric film is provided between the metal film and the semiconductor layer.

8. The semiconductor device according to claim 1,
   wherein the semiconductor layer includes a first conductivity type semiconductor layer and a second conductivity type semiconductor layer, and
   the recessed portion extends through the second conductivity type semiconductor layer into the first conductivity type semiconductor layer, and the enlarged portion is located in the second conductivity type semiconductor layer.

9. A method for manufacturing a semiconductor device comprising:
- a processing step of forming an uneven structure including a recessed portion on one surface side of a semiconductor layer; and
- a deposition step of performing film formation through deposition on the one surface side of the semiconductor layer to form a first deposited film on one surface of the semiconductor layer and to form a second deposited film on a bottom surface of the recessed portion,
- wherein the processing step includes a first step performed by anisotropic etching and a second step including isotropic etching subsequent to the first step.

10. The method for manufacturing a semiconductor device according to claim 9,
- wherein, in the first step, reactive ion etching is used as the anisotropic etching, and
- in the second step including the isotropic etching, a Bosch process is used.

* * * * *